US00RE50525E

(19) United States
(12) Reissued Patent
Lee et al.

(10) Patent Number: US RE50,525 E
(45) Date of Reissued Patent: Aug. 5, 2025

(54) RADIATION-TOLERANT UNIT MOSFET HARDENED AGAINST SINGLE EVENT EFFECT AND TOTAL IONIZATION DOSE EFFECT

(71) Applicant: Korea Advanced Institute of Science and Technology, Daejeon (KR)

(72) Inventors: Hee Chul Lee, Daejeon (KR); Young Tak Roh, Daejeon (KR)

(73) Assignee: Korea Advanced Institute of Science and Technology, Daejeon (KR)

(21) Appl. No.: 17/895,885

(22) Filed: Aug. 25, 2022

Related U.S. Patent Documents

Reissue of:
(64) Patent No.: 10,756,167
Issued: Aug. 25, 2020
Appl. No.: 16/191,250
Filed: Nov. 14, 2018

(30) Foreign Application Priority Data

Apr. 4, 2018 (KR) ..... 10-2018-0039296
Aug. 28, 2018 (KR) ..... 10-2018-0101106

(51) Int. Cl.

| | |
|---|---|
| ***H01L 29/06*** | (2006.01) |
| ***H01L 23/552*** | (2006.01) |
| ***H01L 27/02*** | (2006.01) |
| ***H01L 29/08*** | (2006.01) |
| ***H01L 29/66*** | (2006.01) |
| ***H01L 29/78*** | (2006.01) |

(Continued)

(52) U.S. Cl.
CPC ..... *H10D 62/102* (2025.01); *H01L 23/552* (2013.01); *H10D 30/62* (2025.01); *H10D 30/6211* (2025.01); *H10D 62/151* (2025.01); *H10D 89/813* (2025.01); *H10D 30/0241* (2025.01)

(58) Field of Classification Search
CPC . H01L 29/0607; H01L 23/552; H01L 27/027; H01L 29/0847; H01L 29/785; H01L 29/7851; H01L 29/66803; H01L 29/41791; H01L 21/823493
See application file for complete search history.

(56) References Cited

U.S. PATENT DOCUMENTS 5,260,595 A 11/1993 Hayama
8,497,181 B1 7/2013 Wu et al.
(Continued)

FOREIGN PATENT DOCUMENTS

CN 103219384 A 7/2013
JP 04147676 A 5/1992
(Continued)

OTHER PUBLICATIONS

Sorge et al., Junction Isolated MOS/LDMOS Cascode Arrangement for Radiation Tolerant RF-Power Applications, IEEE (Year: 2016).*
(Continued)

*Primary Examiner* — Leonardo Andujar
(74) *Attorney, Agent, or Firm* — CHRISTENSEN O'CONNOR JOHNSON KINDNESS PLLC

(57) ABSTRACT

Provided is a radiation-tolerant 3D unit MOSFET having at least one selected from a dummy drain (DD), an N-well layer (NW), a deep N-well layer (DNW), and a P+ layer to minimize an influence by a total ionization dose effect and an influence by a single event effect.

31 Claims, 30 Drawing Sheets

(51) Int. Cl.

| | |
|---|---|
| ***H10D 30/62*** | (2025.01) |
| ***H10D 62/10*** | (2025.01) |
| ***H10D 62/13*** | (2025.01) |
| ***H10D 89/60*** | (2025.01) |
| *H10D 30/01* | (2025.01) |

(56) References Cited

U.S. PATENT DOCUMENTS

| | | | | |
|---|---|---|---|---|
| 9,508,852 | B2 * | 11/2016 | Huang | H01L 29/785 |
| 9,515,171 | B1 | 12/2016 | Doris et al. | |
| 2008/0203491 | A1 | 8/2008 | Anderson et al. | |
| 2012/0242373 | A1 | 9/2012 | Chen et al. | |
| 2013/0119445 | A1 | 5/2013 | Huang et al. | |
| 2014/0124851 | A1 | 5/2014 | Gamerith et al. | |
| 2015/0001596 | A1 | 1/2015 | Lee et al. | |
| 2016/0027911 | A1 | 1/2016 | Huang et al. | |
| 2017/0323942 | A1 | 11/2017 | Voldman | |
| 2018/0090391 | A1 | 3/2018 | Park et al. | |

FOREIGN PATENT DOCUMENTS

| | | | |
|---|---|---|---|
| JP | 11297999 | A | 10/1999 |
| KR | 10-2015-0002029 | | 2/2015 |
| KR | 10-2014-0050700 | B1 | 8/2018 |
| WO | 2017048259 | A1 | 3/2017 |

OTHER PUBLICATIONS

Lee et al. Dummy Gate-Assisted n-MOSFET Layout for a Radiation-Tolerant Integrated Circuit, IEEE (Year: 2013).*

Taiwanese Office Action mailed Dec. 11, 2019, issued in Taiwan Patent Application No. 108111955, filed Apr. 3, 2019, 14 pages.

Calomardi, A., et al., "Active charge collection strategy for radiation environment at device level," 2016 IEEE, 4 pages.

Wu, Z., et al., "nMOS Transistor Location Adjustment for N-Hit Single-Event Transient Mitigation in 65-nm CMOS Bulk Technology," IEEE Transactions on Nuclear Science, vol. 65, No. 2, Jan. 2018, pp. 418-425.

Xu, X. Y., et al., "Effects of drain-wall in mitigating N-hit single event transient via 45nm CMOS process," Semiconductor Science and Technology, 30 (2015), 10 pages.

Zhang, C., et al., "Research on Single-Event Transient Mechanism in a Novel SOI CMOS Technology," IEICE Electronics Express 11(18):1-10, Sep. 2014.

* cited by examiner

RADIATION-TOLERANT UNIT MOSFET HARDENED AGAINST SINGLE EVENT EFFECT AND TOTAL IONIZATION DOSE EFFECT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCES TO RELATED APPLICATIONS

[This application] *Notice: The present application is an application for reissue of U.S. patent application Ser. No. 16/191,250 now U.S. Pat. No. 10,756,167. U.S. patent application Ser. No. 16/191,250 now U.S. Pat. No. 10,756, 167* claims priority under 35 U.S.C. § 119 to Korean Patent Application No. 10-2018-0101106 filed on Aug. 28, 2018 and No. 10-2018-0039296 filed on Apr. 4, 2018 in the Korean Intellectual Property Office, the disclosures of which are incorporated by reference herein in their entireties.

BACKGROUND

Embodiments of the inventive concepts described herein relate to radiation-tolerant 3-dimensional unit metal-oxide field-effect transistors (3D unit MOSFETs) and more particularly, relate to 3D unit MOSFETs having radiation-tolerant characteristics hardened against single event effects and total ionization dose effects.

Radiation is referred to the flow of energy emitted from atomic or molecular components when the atomic or molecular components are unstable at higher energy levels. The radiation is represented in the radiation form of an X-ray, a gamma ray, an alpha ray, a beta ray, neutrons, or protons. The radiations are classified into a particle form or an electromagnetic-wave form. The particle form is referred to as a particle radiation, and the electromagnetic-wave form is referred to as an electromagnetic-wave radiation.

Although the radiations are different from each other, the intensity of the radiation or the influence exerted on an object may be estimated, based on the basic concept of energy flow, depending on the size of an amount of transmitted energy or the size of an amount of absorbed energy. The radiation may be incident to produce ions, which is called "ionizing radiation", and other radiations are called "non-ionizing radiations." In particular, the ionizing radiation causes the damage to a unit MOSFET constituting an electronic part by ionizing atoms of a semiconductor material of the unit MOSFET. Accordingly, the normal operation of the electronic part is not ensured and temporarily or permanently damages.

The damage to a semiconductor device by the incidence of the radiation is mainly classified into a total ionization dose effect and a single event effect.

If the width of the oxide film of a transistor is 10 nm or more, and if the ionizing radiation is incident to a part having an electric field, holes are trapped at the interface between the oxide film and the silicon. More specifically, if the ionizing radiation is incident in the state that a voltage is applied to the gate, hole trapping is caused at an oxide film interface between a source and a drain and thus channel inversion occurs, thereby forming a leakage current path that current flows. The leakage current path formed by the ionizing radiation causes an abnormal operation of the unit MOSFET, which is called the total ionization dose effect.

FIG. 1 is a view illustrating the configuration of a [planer] *planar* MOSFET according to the related art. FIG. 2 is view illustrating the configuration of a FinFet which is one of a 3D unit MOSFET. FIG. 3 is a view illustrating the configuration of a gate-all-around MOSFET (GAA MOSFET) which is one of the 3D unit MOSFET.

The [planer] *planar* MOSFET of FIG. 1 includes a gate to control the operation of the transistor, and a source, a drain, and a body (*or substrate*) through which a current flows by the gate.

The 3D unit MOSFET of FIGS. 2A and 2B and FIGS. 3A and 3B is configured in the shape of surrounding three planes (in the case of the FinFET of FIGS. 2A and 2B) or four planes (in the case of the GAA MOSFET of FIGS. 3A and 3B) of the gate. The source and the drain of the 3D unit MOSFET are positioned at both sides of the gate. Accordingly, the current signal by the gate flows to the source and the drain similarly to the conventional [planer] *planar* MOSFET.

The unit MOSFET illustrated in FIGS. 1 to 3 is formed on a silicon substrate, and the source, the drain, and the body of each unit MOSFET includes PN junctions. For example, in the PN junction of the unit MOSFET, when forming a reverse bias that a positive voltage is applied to an N-type part and a negative voltage is applied to a P-type part, and when the ionizing radiation is incident, electron-hole pairs are produced and electrons and holes flow in a source-drain direction and a body direction by an electric field formed by the reverse bias.

In general, since a current pulse is higher than an equilibrium state of a built-in potential in the state that the reverse bias is applied to the PN junction, carriers may not move into an opposite region, and thus a current does not flow. In contrast, the current pulse, which is generated as the ionizing radiation is incident, affects a circuit including the unit MOSFET, thereby causing a problem of changing stored data. The phenomenon is called the single event effect. In particular, recently, as a process becomes smaller, a gate capacitance is reduced. Accordingly, the influence by the current pulse generated due to the single event effect is strongly represented.

The total ionization dose effect and the single event effect make it difficult to ensure the normal operation of the unit MOSFET under the radiation environment and make a circuit or a system, which includes the unit MOSFET, abnormally operating under the radiation environment.

PRIOR ART

Patent Documents

U.S. Pat. No. 8,907,380 entitled "RADIATION TOLERANT DUMMY GATE-ASSISTED N-MOSFET, AND METHOD AND APPARATUS FOR MODELING CHANNEL OF SEMICONDUCTOR DEVICE"

Korean Patent Registration No. 10-1492807 entitled "UNIT MOSFET USING RADIATION-TOLERANT DUMMY GATE."

Korean Patent Registration No. 10-1494808 "APPARATUS AND METHOD FOR MODELING CHANNEL OF SEMICONDUCTOR DEVICE."

Non-Patent Document

"Dummy Gate-Assisted n-MOSFET Layout for a Radiation-Tolerant Integrated Circuit", Min Su Lee and Hee Chul Lee, IEEE Transactions on Nuclear Science, 60(4), 3084-3091, 2013

"TID and SEE Hardened n-MOSFET Layout on a Bulk Silicon Substrate which Combines a DGA n-MOSFET and a Guard Drain", in Proc. 2015 IEEE Nuclear Science Symposium and Medical Imaging Conference (NSS/MIC), DOI: 10.1109/NSSMIC.2015.7581808, 2015.

SUMMARY

Embodiments of the inventive concept provide a radiation-tolerant 3D unit MOSFET capable of minimizing the influence by a current pulse produced due to a single event effects.

Embodiments of the inventive concept provide a radiation-tolerant 3D unit MOSFET capable of preventing a leakage current path from being formed from fixed charges produced in a field oxide film due to a total ionization dose effect.

According to an exemplary embodiment, a radiation-tolerant 3-dimensional unit metal-oxide field-effect transistor (3D unit MOSFET) to reduce an influence by a current pulse generated due to a single event effect and an influence by a total ionization dose effect includes a gate, a source and a drain, and a dummy drain (DD) connected with the source and the drain to be positioned on a Fin structure of the radiation-tolerant 3D unit MOSFET and being able to apply a voltage to disperse the current pulse generated due to the influence by the single event effect.

The DD may be positioned to be connected with a neutral region connected with at least one of the source and the drain.

The DD may be connected with at least one lateral side surface of a left side and a right side of the source and the drain, and formed in a 'T' shape, a substantial 'C' shape, or the 'I' shape.

The DD may apply a voltage to the source and the drain, disperse a current flowing through the source and the drain due to the single event effect, and reduce the influence exerted on a circuit region or a system connected with a device.

In addition, according to an embodiment of the inventive concept, the radiation-tolerant 3D unit MOSFET may further include an N-well layer formed while being spaced apart from the source and the drain, the gate, and the DD by a specific distance.

The N-well layer may be formed on a surface of the substrate to surround the Fin structure of the radiation-tolerant 3D unit MOSFET.

According to an embodiment of the inventive concept, the radiation-tolerant 3D unit MOSFET may further include an N-well/metal-1 via to additionally apply a voltage to the N-well layer, and the N-well/metal-1 via may be formed in the surface of the substrate to overlap with the N-well layer.

In addition, according to an embodiment of the inventive concept, the radiation-tolerant 3D unit MOSFET may further include a deep N-well layer formed at a lower portion of the Fin structure of the radiation-tolerant 3D unit MOSFET.

The deep N-well layer may be formed under the gate, the source and the drain, the DD, and the N-well layer positioned in the Fin structure of the radiation-tolerant 3D unit MOSFET and formed with a length to cover the N-well layer.

According to an embodiment of the inventive concept, a radiation-tolerant 3D unit MOSFET to reduce an influence by a current pulse generated due to a single event effect and an influence by a total ionization dose effect includes a gate, a source and a drain, and a P+ layer positioned on a lateral side surface of a field oxide film positioned at a contact point between the gate and a substrate to prevent a leakage current path from being formed due to the influence by the total ionization dose effect.

The P+ layer may prevent the leakage current path from being formed from a fixed charge produced at an interface of the field oxide film due to the influence by the total ionization dose effect.

In addition, according to an embodiment of the inventive concept, the radiation-tolerant 3D unit MOSFET of claim 10 may further include a DD connected with the source and the drain to be positioned on a Fin structure of the radiation-tolerant 3-D unit MOSFET and being able to apply a voltage.

According to an embodiment of the inventive concept, the radiation-tolerant 3D unit MOSFET may further include an N-well layer formed while being spaced apart from the gate, the source and the drain, and the DD by a specific distance, and a deep N-well layer formed at a lower portion of the Fin structure of the radiation-tolerant 3D unit MOSFET, such that the current pulse generated due to the single event effect to flow to the source and the drain is dispersed or blocked.

According to an embodiment of the inventive concept, a radiation-tolerant 3D unit MOSFET to reduce an influence by a current pulse generated due to a single event effect and an influence by a total ionization dose effect, the radiation-tolerant 3D unit MOSFET may include a gate, a source and a drain, a P+ layer positioned on a lateral side surface of a field oxide film positioned at a contact point between the gate and a substrate to prevent a leakage current path from being formed due to the influence by the total ionization dose effect, and a deep N-well layer formed at a lower portion of the Fin structure of the radiation-tolerant 3D unit MOSFET.

The deep N-well layer may block electron hole pairs, which are generated by the influence of the single event effect, from being collected.

The above-described radiation-tolerant 3D unit MOSFET may be implemented with a p-channel MOSFET (PMOS) including a PMOS gate electrode pattern or an n-channel MOSFET (NMOS) including an NMOS gate electrode pattern.

DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Figure 1:
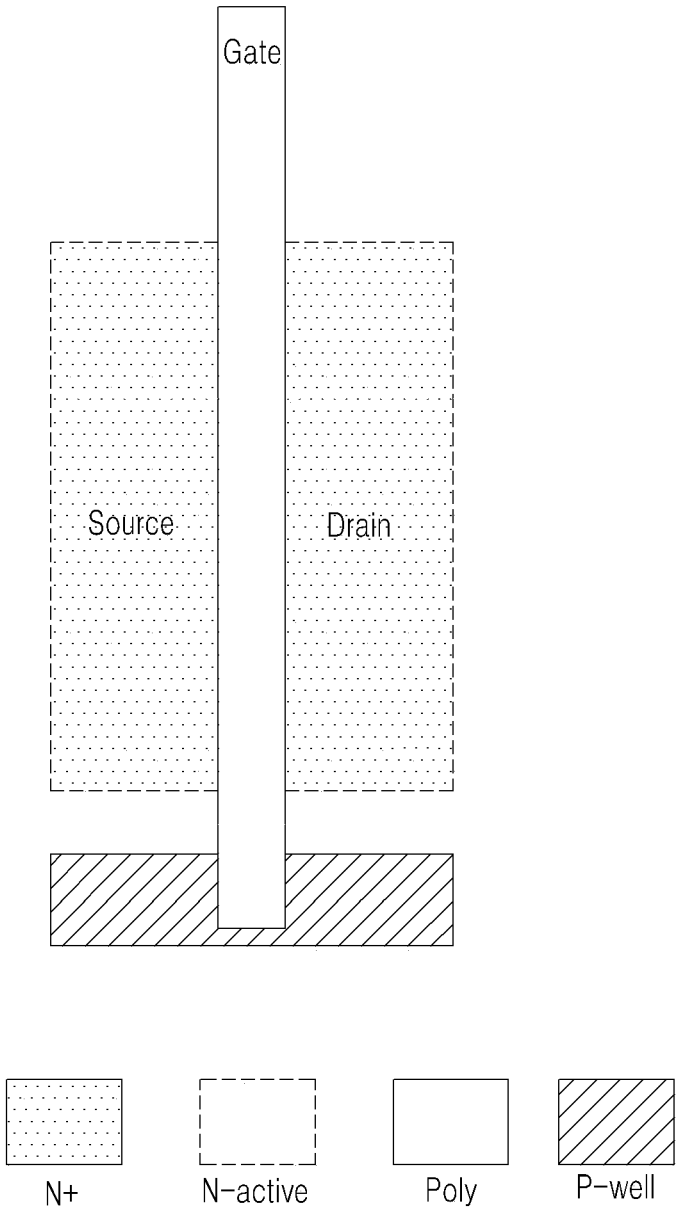
FIG. 1 (PRIOR ART)
FIG. 1 illustrates the configuration of a conventional [planer-type] *planar-type* MOSFET.
Figure 2A:
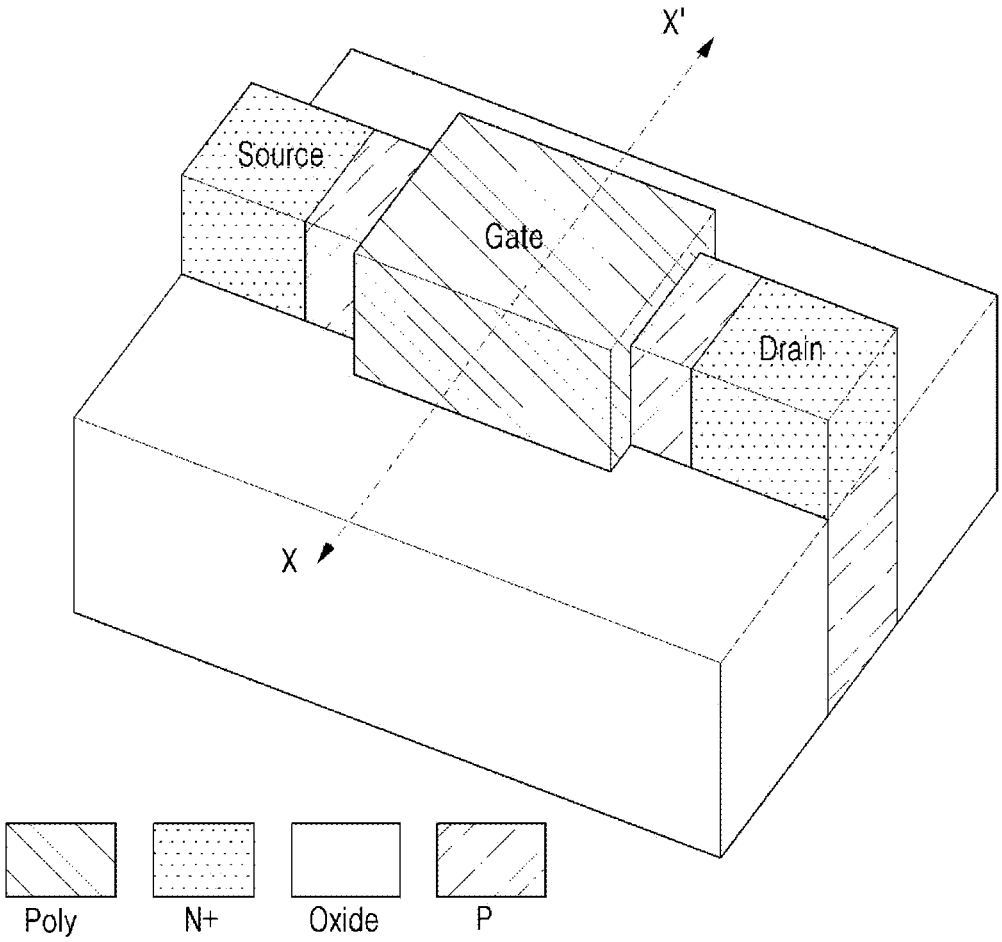
FIG. 2A (PRIOR ART)
FIGS. 2A and 2B illustrate the configuration of a FinFet which is one of a 3D unit MOSFET.
Figure 2B:
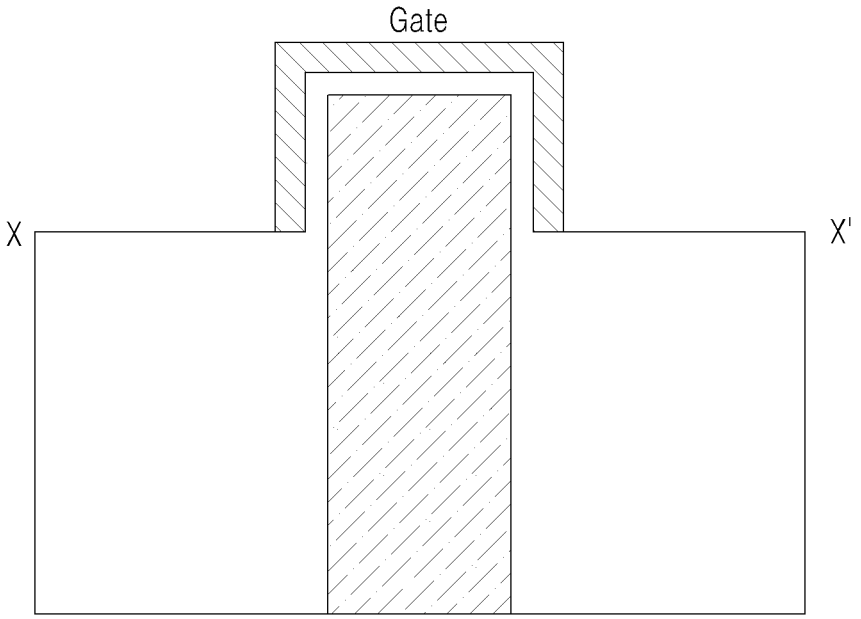
FIG. 2B (PRIOR ART)
Figure 3A:
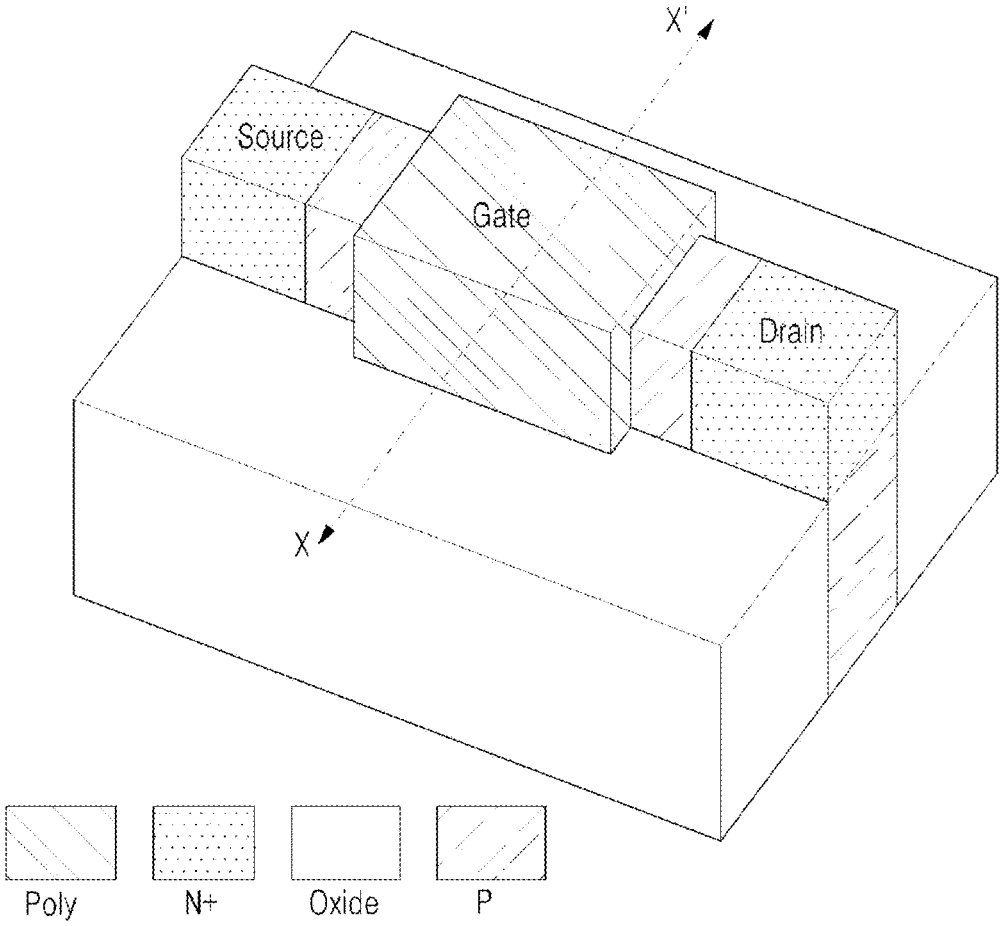
FIG. 3A (PRIOR ART)
FIGS. 3A and 3B illustrate the configuration of a gate-all-around MOSFET (GAA MOSFET) which is one of the 3D unit MOSFET.
Figure 3B:
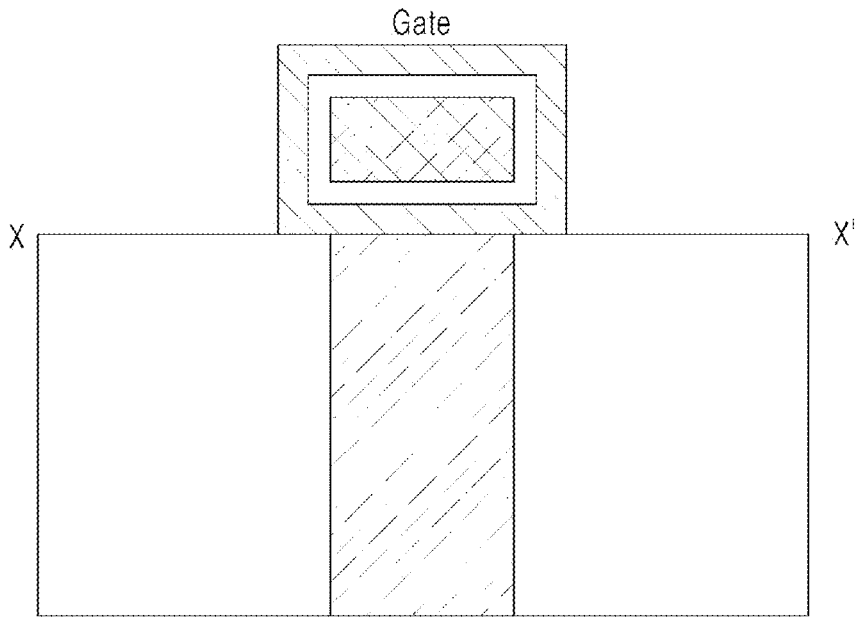
FIG. 3B (PRIOR ART)

Hereinafter, an exemplary embodiment of the inventive concept will be described in detail with reference to accompanying drawings. However, in the following description of the inventive concept, a detailed description of well-known features or functions will be ruled out in order not to unnecessarily obscure the gist of the inventive concept. In addition, it should be noticed that the same components are assigned with the same reference numerals throughout the whole accompanying drawings.

Terms and words used in the present specification and the claims shall not be interpreted as commonly-used dictionary meanings, but shall be interpreted as to be relevant to the technical scope of the invention based on the fact that the inventor may properly define the concept of the terms to explain the invention in best ways.

Therefore, the embodiments and the configurations depicted in the drawings are illustrative purposes only and do not represent all technical scopes of the embodiments, so it should be understood that various equivalents and modifications may exist at the time of filing this application.

Some components in the accompanying drawings may be exaggerated, omitted or schematically drawn for the purpose of convenience or clarity. In addition, the size of each component does not utterly reflect an actual size. Accordingly, the inventive concept is not limited to the relative size or gap shown in accompanying drawings.

In the following description, when a certain part "includes" a certain component, the certain part does not exclude other components, but may further include other components if there is a specific opposite description. When a certain part is [“liked to”] *“linked to”*, “coupled to”, or “connected with” another part, the certain part may be directly linked to or connected with the another part, and a third part may be electrically “linked”, “coupled”, or “connected” between the certain part and the another part.

The singular expression includes a plural expression, unless the context clearly indicates otherwise. It will be further understood that the terms “comprises,” “comprising,” “includes,” or “including,” or “having” specify the presence of stated features, numbers, steps, operations, components, parts, or the combination thereof, but do not preclude the presence or addition of one or more other features, numbers, steps, operations, components, components, and/or the combination thereof.

The term “unit” used herein may refer to software or hardware such as field programmable gate array (FPGA) or application specific integrated circuit (ASIC), and the “unit” may perform some functions. However, the “unit” may be not limited to software or hardware. The “unit” may be configured to exist in an addressable storage medium or may be configured to reproduce one or more processors. Therefore, as an example, “units” may include various elements such as software elements, object-oriented software elements, class elements, and task elements, processes, functions, attributes, procedures, subroutines, program code segments, drivers, firmware, microcodes, circuits, data, databases, data structures, tables, arrays, and variables. Functions provided in “units” and elements may be combined into a smaller number of “units” and elements or may be divided into additional “units” and elements.

Hereinafter, the embodiment of the inventive concept will be described in detail with reference to accompanying drawings to allow those skilled in the art to easily reproduce the inventive concept. However, the inventive concept may be implemented in various forms, and is limited to embodiments described herein. In addition, to clearly describe the inventive concept, part, which is irrelevant to the description, is omitted and similar reference numerals will be assigned to similar parts through the whole specification.

Hereinafter, the principle of the unit MOSFET will be described in detail before the description of the embodiment of the inventive concept.

FIG. 1 illustrates the configuration of a conventional [planer] *planar* MOSFET, and the [planer] *planar* unit MOSFET includes an N-active layer, a gate layer, and an N+ layer. In this case, the layout of each component plays the following roles.

The N-active layer is to designate an active region of a transistor and to prevent an isolation field oxide from being produced in a relevant region during process. The gate layer is to designate a gate region by forming a gate oxide layer. The N+ layer is a layer formed in a self-align scheme and used to create a source and a drain having a higher N-type doping concentration.

Recently, as the process becomes smaller, the conventional planar MOSFET has a problem in controlling operations through the gate. To solve the problems, the 3D unit MOSFET having a gate formed in a 3D is developed.

FIGS. 2A to 3B illustrate the configurations of the 3D unit MOSFETs. The 3D unit MOSFETs of a FinFet and a GAA MOSFET are distinguished there between depending on the structures of gate regions. The 3D unit MOSFET includes an N-active layer, a poly gate layer, and an N+ layer, similarly to the structure of the conventional planar MOSFET.

The 3D unit MOSFET has an insulating film (oxide film) at a lower end portion of a Fin to distinguish between MOSFETs and has a leakage current passage formed from the Fin to lower end portion of the gate, due to fixed charges produced by a radiation, which is different [form] *from* the planar unit MOSFET. To solve the problem of the fixed charges, conventionally, a higher voltage is temporarily applied across opposite ends of a drain and a source to remove the fixed charges from the insulating film through an annealing process based on [Jole] *Joule* heating made a resistor of the Fin. However, the annealing process may not be actively performed under the radiation environment through the conventional method. In addition, an additional component for the annealing process is required.

In terms of the single event effect, as the process becomes smaller, since a gate capacitance and a junction capacitance are decreased, data upset occurs and thus the critical charge is reduced. Even if a current pulse generated due to the single event effect is relatively slightly generated, the current pulse may cause the malfunction of an electronic component including the 3D unit MOSFET.

The inventive concept suggests a radiation-tolerant 3D unit MOSFET having at least one selected from a dummy drain (DD), an N-well layer (NW), a deep N-well layer (DNW), and a P+ layer in order to minimize the influence of the total ionization dose effect and the single event effect described above. The above layers reduce single event current pulses, which are generated by the radiation to flow through the source and the drain, and prevent the leakage current path from being formed due to the total ionization dose effect.

Although the following description will be made in that the radiation-tolerant 3D unit MOSFET is classified as an NMOS including a source and a drain in N-type semiconductor regions and an NMOS gate electrode pattern having a substrate which is in a P-type semiconductor region, the inventive concept is not limited to the NMOS. For example, the radiation-tolerant 3D unit MOSFET may be implemented as a PMOS (for example, the source and the drain are in P-type semiconductor regions and the substrate is in the N-type semiconductor region) having a PMOS gate electrode pattern.

According to the inventive concept, a radiation-tolerant 3D unit MOSFET hardened against the single event effect and the total ionization dose effect exhibits following three effects.

First, according to the inventive concept, a current is dispersed by using a dummy drain (DD).

Electrons and holes generate current pulses in the direction of the source and the drain and the direction of the body, due to the electric field produced by the reverse bias applied to the PN junction of the transistor. Accordingly, according to an embodiment of the inventive concept, the radiation-tolerant 3D unit MOSFET may reduce a current flowing to the source and the drain due to the single event effect, by using a dummy drain (DD) for applying a voltage to the side of the source and the drain.

However, when the DDs are positioned while distinguishing between an existing transistor and an isolation field oxide, the effect of the DDs may be reduced. Accordingly, according to an embodiment of the inventive concept, in the radiation-tolerant 3D unit MOSFET, an active region is expanded through an N-active layer, an N+ layer is used as the DD, and the voltage is applied through an N+/Metal-1 via. Therefore, the current pulses generated due to the single event effect are allowed to flow to the direction of the DD positioned at the upper position, thereby reducing the single event effect.

Second, according to the inventive concept, the leakage current path is prevented by using the P+ layer.

According to an embodiment of the inventive concept, the radiation-tolerant 3D unit MOSFET includes a P+ layer formed at a lower end portion of the Fin structure [surrounding] *surrounded by* the gate having the channel. The P+ layer positioned at the lower end portion of the Fin structure is positioned at an insulating interface formed due to the total ionization dose effect to prevent the leakage current path from being formed from fixed charges. As the leakage current path is prevented, the influence by the total ionization dose effect may be reduced.

Third, according to the inventive concept, the single event effect may be reduced by using the N-well layer and the deep N-well layer.

The PN junction is formed between the source and the drain, and the substrate of the transistor. The depth that electron hole pairs produced due to the single effect event are collected is about three times greater than the depletion width formed in PN junction.

According to another embodiment of the inventive concept, the radiation-tolerant 3D unit MOSFET may reduce a current flowing through the source and the drain connected with a circuit by allowing the electron hole pairs, which are produced at the substrate, to flow through a wall surface or a bottom surface.

In more detail, according to another embodiment of the inventive concept, the radiation-tolerant 3D unit MOSFET may include a deep N-well layer formed on the bottom surface and an N-well layer formed to surround the lateral side surface. The N-well layer may be connected with the deep N-well layer formed on the bottom surface, and the N-well/metal-1 via may be formed on the N-well layer. According to another embodiment of the inventive concept, the radiation-tolerant 3D unit MOSFET allows the current pulses generated due to the single event effect to flow through the lateral side surface and the bottom surface by applying an additional voltage through the N-well/Metal-1 via, thereby reducing the single event effect.

Hereinafter, the radiation-tolerant 3D unit MOSFET described above will be described in detail with reference to FIGS. 4A to 15.

Figure 4A:
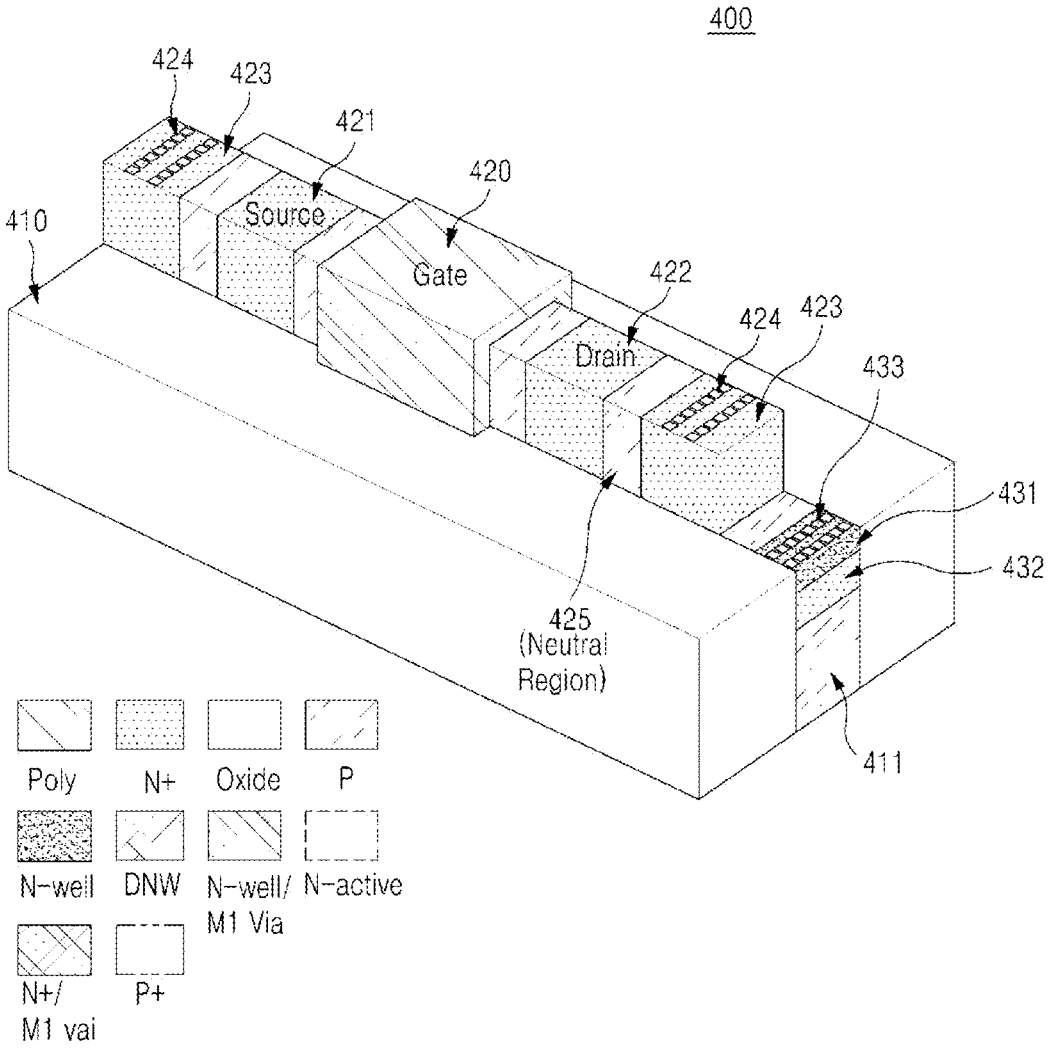
FIGS. 4A and 4B illustrate the configuration of the radiation-tolerant 3D unit MOSFET, according to an embodiment of the inventive concept.
Figure 4B:
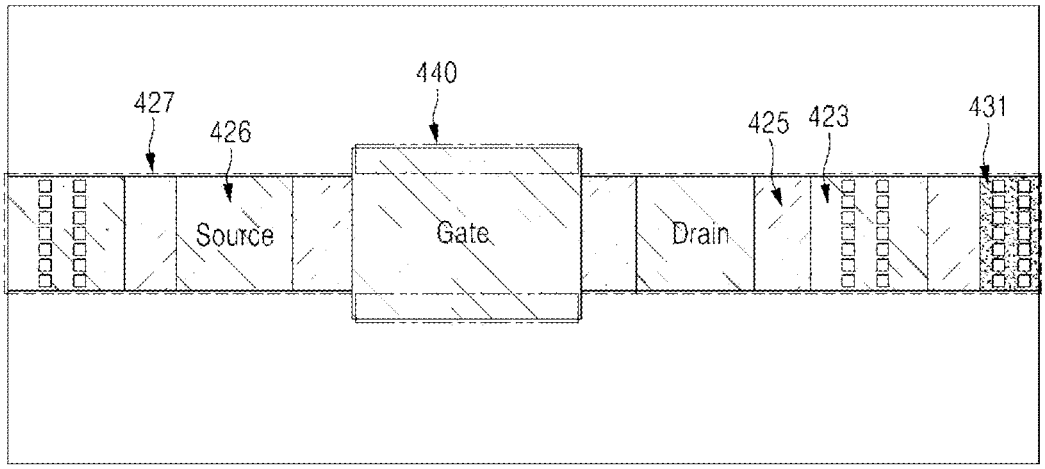
Figure 5A:
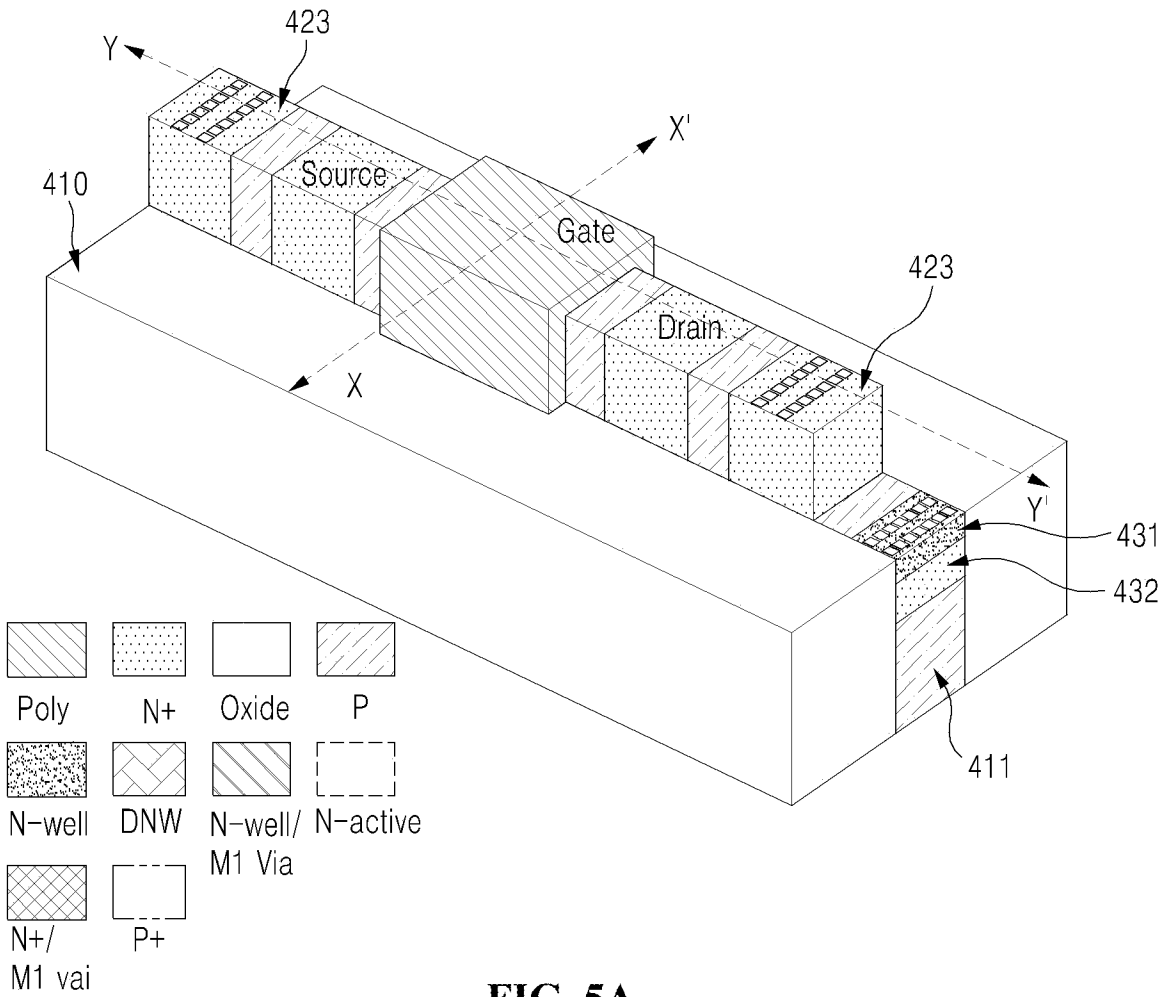
FIGS. 5A to 5C illustrate the radiation-tolerant 3D unit MOSFET, according to Embodiment 1 of the inventive concept.
Figure 5B:
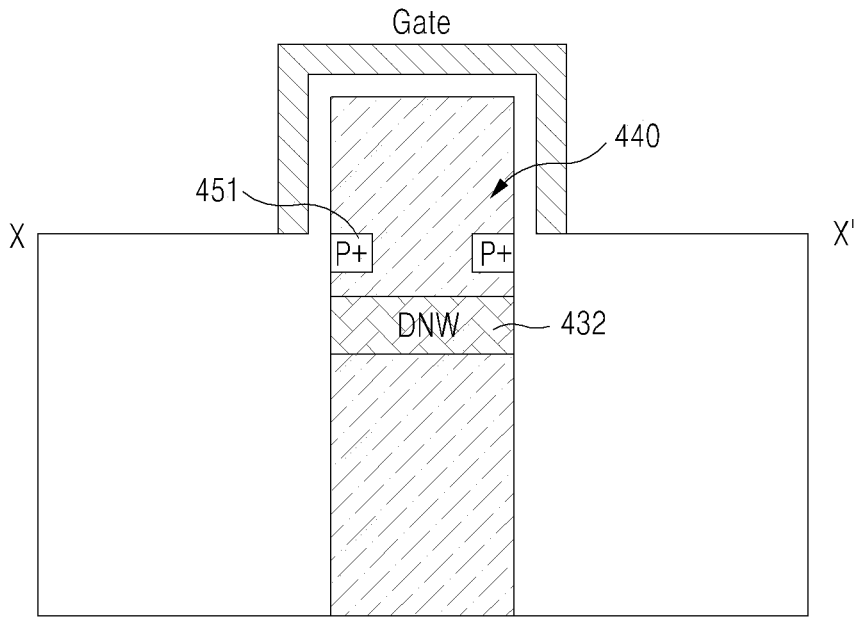
Figure 5C:
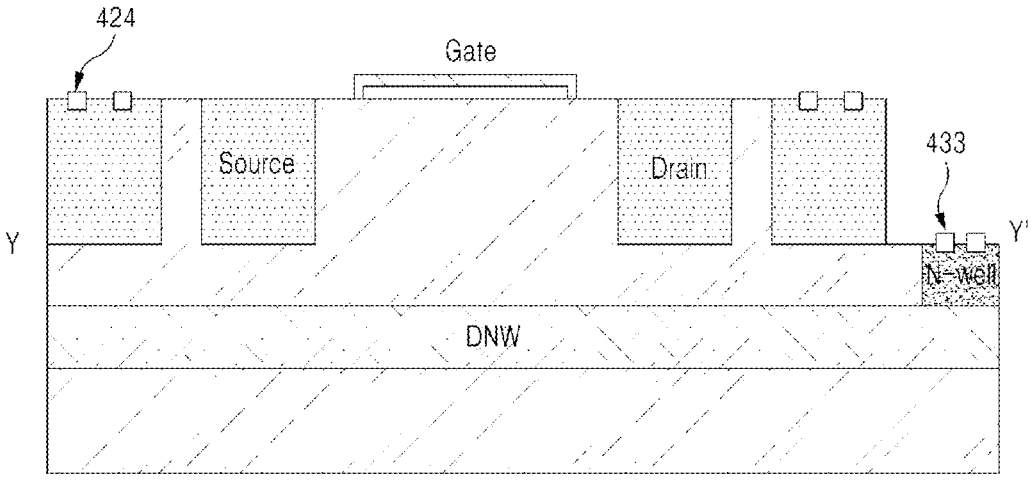

FIGS. 4A and 4B illustrate the configuration of the radiation-tolerant 3D unit MOSFET according to an embodiment of the inventive concept, and FIGS. 5A to 5C illustrate the configuration of the radiation-tolerant 3D unit MOSFET according to an embodiment of the inventive concept.

Referring to FIGS. 4A and 5A, according to the inventive concept, a radiation-tolerant 3D unit MOSFET 400 includes dummy drains 423 formed at the left and right sides thereof, N-well layers 431 formed outside the dummy drains 423, and a deep N-well layer 432 formed under the N-well layer 431. The above configuration is, in more detail, illustrated in FIGS. 5B and 5C, and the N-well layers 431 and the deep N-well layer 432 may be configured to surround the lateral side surfaces and the bottom surface of the radiation-tolerant 3D unit MOSFET 400.

In addition, the radiation-tolerant 3D unit MOSFET 400 including a gate 420 may include P+ layers 451 formed on internal lateral side surfaces of the Fin structure. Referring to FIG. 5B, at the lower end portion of the Fin structure surrounded by the gate 420, the P+ layers 451 formed on the internal lateral side surfaces of the substrate (or the *outer lateral side surfaces of the* insulating layer 410) may prevent the variation in a threshold voltage due to the fixed charges produced by the total radiation, thereby preventing the leakage current path from being formed.

Referring to FIG. 4A again, according to an embodiment of the inventive concept, the radiation-tolerant 3D unit MOSFET 400 includes the gate 420, a source 421 and a drain 422, and a DD 423.

The DD 423 is connected with the source 421 and the drain 422 to be positioned on the Fin structure of the radiation-tolerant 3D unit MOSFET 400 and a voltage is able to be applied to the DD 423, thereby dispersing a current pulse generated due to the single event effect.

The DD 423 may be positioned to be connected with a neutral region 425 connected with at least any one of the source 421 and the drain 422, and may be formed in a 'T' shape, a substantial 'C' shape, or an 'I' shape. The detail of the DD 423 formed in the 'T' shape, the substantial 'C' shape, or the 'I' shape on at least any one of the left side and the right side of the source 421 and the drain 422 will be described in detail with reference to FIGS. 9 to 14.

The dummy drain 423 applies a voltage to the source 421 and the drain 422, disperses a current flowing through the source 421 and the drain 422 due to the single event effect, and reduces the influence exerted on the circuit region or the system connected with a device. To this end, according to an embodiment of the inventive concept, the radiation-tolerant 3D unit MOSFET 400 may include a P-active layer 440 of a gate, and an N-active layer 427, an N+ layer 426, and an N+/Metal-1 via (N+/Metal-1 via) 424 in the Fin structure, as illustrated FIGS. 4A and 4B. In more detail, the P-active layer 440 of the gate is positioned at the part that the lower end portion of the gate 420 is coupled to the thick oxide film layer 410. The radiation-tolerant 3D unit MOSFET 400 according to an embodiment of the inventive concept, which has the P-active layer 440—the P+ layer 451—N-active layer 427—N+ layer 426, may prevent the variation in the threshold voltage that may occur due to the fixed charges.

The electron hole pair produced due to the single event effect is caused by an electric field generated by the reverse bias applied to the PN junction of a transistor and generates current pulses in the direction of the source 421 and the drain 422 and the direction of the body 411.

According to an embodiment of the inventive concept, the radiation-tolerant 3D unit MOSFET 400 include an N-well layer 431 and a deep N-well layer (DNW) 432 and allows a current pulse to flow through the lateral side surface or the bottom surface by using the N-well layer 431 and the deep N-well layer 432, thereby reducing the current pulses flowing through the source 421 and *the drain* 422. To this end, according to an embodiment of the inventive concept, the radiation-tolerant 3D unit MOSFET 400 may include the N-well layer 431, the deep N-well layer 432, and the N-well/Metal-1 via 433, as illustrated in FIGS. 4A and 4B.

The N-well layer 431 may be formed while being spaced apart from the gate 420, the source 421, and the drain 422, and the dummy drain 423 by a predetermined distance and may be formed on the surface of the [substrate 410] *body 411* to surround the Fin structure of the radiation-tolerant 3D unit MOSFET 400.

In this case, according to an embodiment of the inventive concept, the radiation-tolerant 3D unit MOSFET 400 may further include an N-well/Metal-1 via 433 to additionally apply a voltage to the N-well layer 431. The N-well/Metal-1 via 433 is formed on the surface of the [substrate 410] *body 411* to overlap with the N-well layer 431.

The deep N-well layer 432 may be formed under the gate 420, the source 421 and the drain 422, the DD 423, and the N-well layer 431 positioned in the Fin structure of the radiation-tolerant 3D unit MOSFET 400 and may be formed with a length to cover the N-well layer 431.

Hereinafter, various embodiments of the inventive concept will be described with reference to accompanying drawings.

The following description will be made by employing, as Embodiment 1, the radiation-tolerant 3D unit MOSFET 400 provided by applying all the DD 423, the N-well layer 431, the deep N-well layer (DNW) 432, and the P+ layer 451, by employing, as Embodiment 2, the radiation-tolerant 3D unit MOSFET 400 provided by applying only the DD 423, by employing, as Embodiment 3, the radiation-tolerant 3D unit MOSFET 400 provided by applying the DD 423 and the deep N-well layer (DNW) 432, and by employing, as Embodiment 4, the radiation-tolerant 3D unit MOSFET 400 provided by applying only the deep N-well layer (DNW) 432 is applied.

In addition, the following description will be made by employing, as Embodiment 5, the radiation-tolerant 3D unit MOSFET 400 provided by applying a single DD 423 aligned with the source 421, the gate 420, and the drain 422 in a row and by employing, as Embodiment 6, the radiation-tolerant 3D unit MOSFET 400 provided by applying a single DD 423 positioned at the left side or the right side of the source 421 and the drain 422.

Further, the following description will be made by employing, as Embodiment 7, the radiation-tolerant 3D unit MOSFET 400 provided by applying DDs 423 positioned at the left side and the right side of the source 421 and the drain 422 to represent the 'T' shape, by employing, as Embodiment 8, the radiation-tolerant 3D unit MOSFET 400 provided by applying a DD 423 positioned at the left side or the right side of the source 421 and the drain 422 to represent the substantial 'C' shape, by employing, as Embodiment 9, the radiation-tolerant 3D unit MOSFET 400 provided by applying single DDs 423 positioned at the left side and the right side of the source 421 and the drain 422, respectively, and by employing, as Embodiment 10, the radiation-tolerant 3D unit MOSFET 400 provided by applying DDs 423 positioned at both the left side and the right side of the source 421 and the drain 422 to represent the 'I' shape.

Embodiment 1

FIGS. 5A to 5C illustrate the radiation-tolerant 3D unit MOSFET according to Embodiment 1 of the inventive concept.

In more detail, FIG. 5A illustrates a schematic view of the radiation-tolerant 3D unit MOSFET according to Embodiment 1 of the inventive concept, FIG. 5B illustrates a sectional view taken along line X-X' of FIG. 5A, and FIG. 5C illustrates a sectional view taken along line Y-Y' of FIG. 5A.

Referring to FIGS. 5A to 5C, the radiation-tolerant 3D unit MOSFET 400 may include all the DDs 423, the N-well layer 431, the deep N-well layer (DNW) 432, and the P+ layer 451. In this case, since the description of the structures of each layer and the radiation-tolerant 3D unit MOSFET 400 has been already described above, the details thereof will be omitted from the following description.

Embodiment 2

Figure 6A:
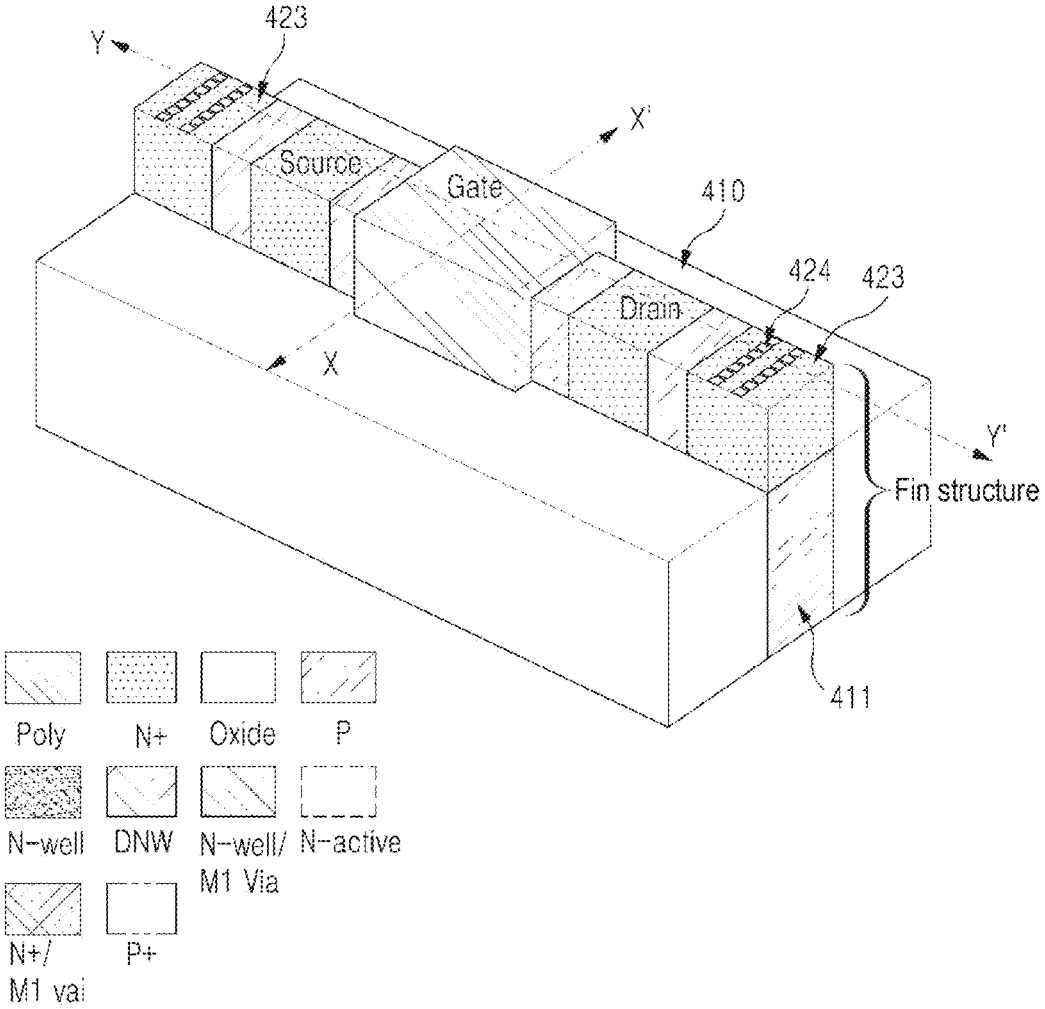
FIGS. 6A to 6C illustrate the radiation-tolerant 3D unit MOSFET, according to Embodiment 2 of the inventive concept.
Figure 6B:
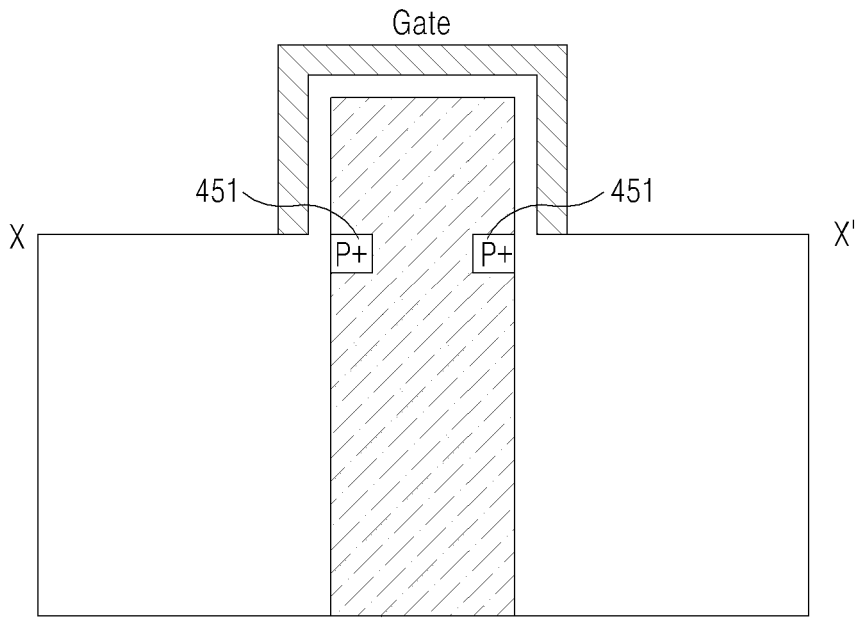
Figure 6C:
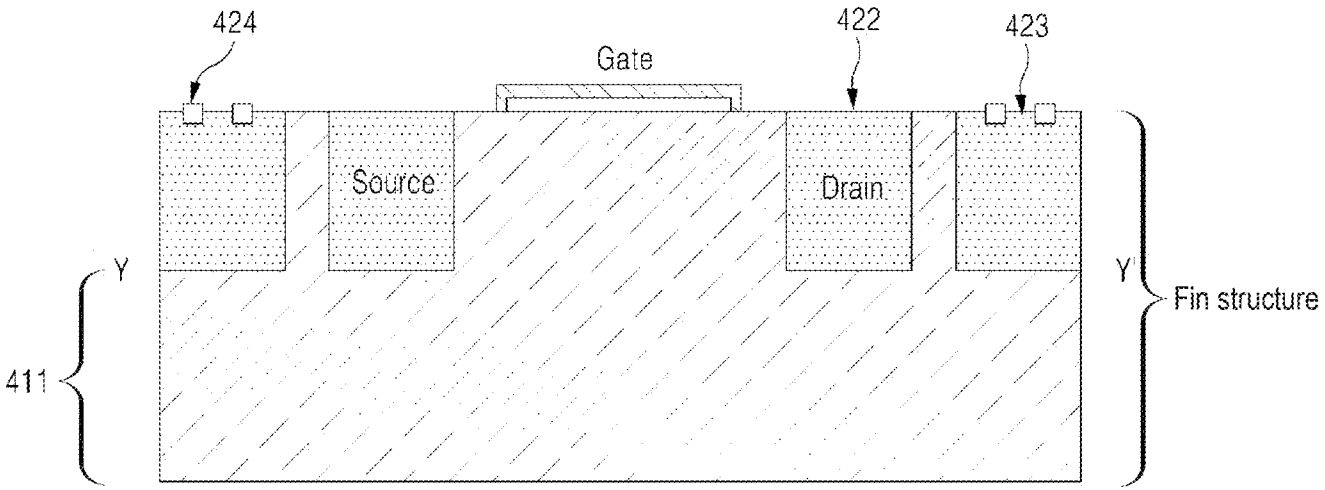

FIGS. 6A to 6C illustrate the radiation-tolerant 3D unit MOSFET according to Embodiment 2 of the inventive concept.

In more detail, FIG. 6A illustrates a schematic view of the radiation-tolerant 3D unit MOSFET according to Embodiment 2 of the inventive concept, FIG. 6B illustrates a sectional view taken along line X-X' of FIG. 6A, and FIG. 6C illustrates a sectional view taken along line Y-Y' of FIG. 6A.

In FIGS. 6A to 6C, the radiation-tolerant 3D unit MOSFET 400 may be obtained by employing only the DD 423 through the P+ layer 451, the P-active layer 440 of the gate, and the N-active layer 427, the N+ layer 426, and the N+/Metal-1 via 424 forming the Fin structure.

The structure of the radiation-tolerant 3D unit MOSFET 400 illustrated in FIGS. 6A to 6C may be implemented with an area narrower than that of Embodiment 1, and may be easily used when the structure of Embodiment 1 may not be used or the deep N-well layer (DNW) 432 may not be used due to the process characteristic.

Embodiment 3

Figure 7A:
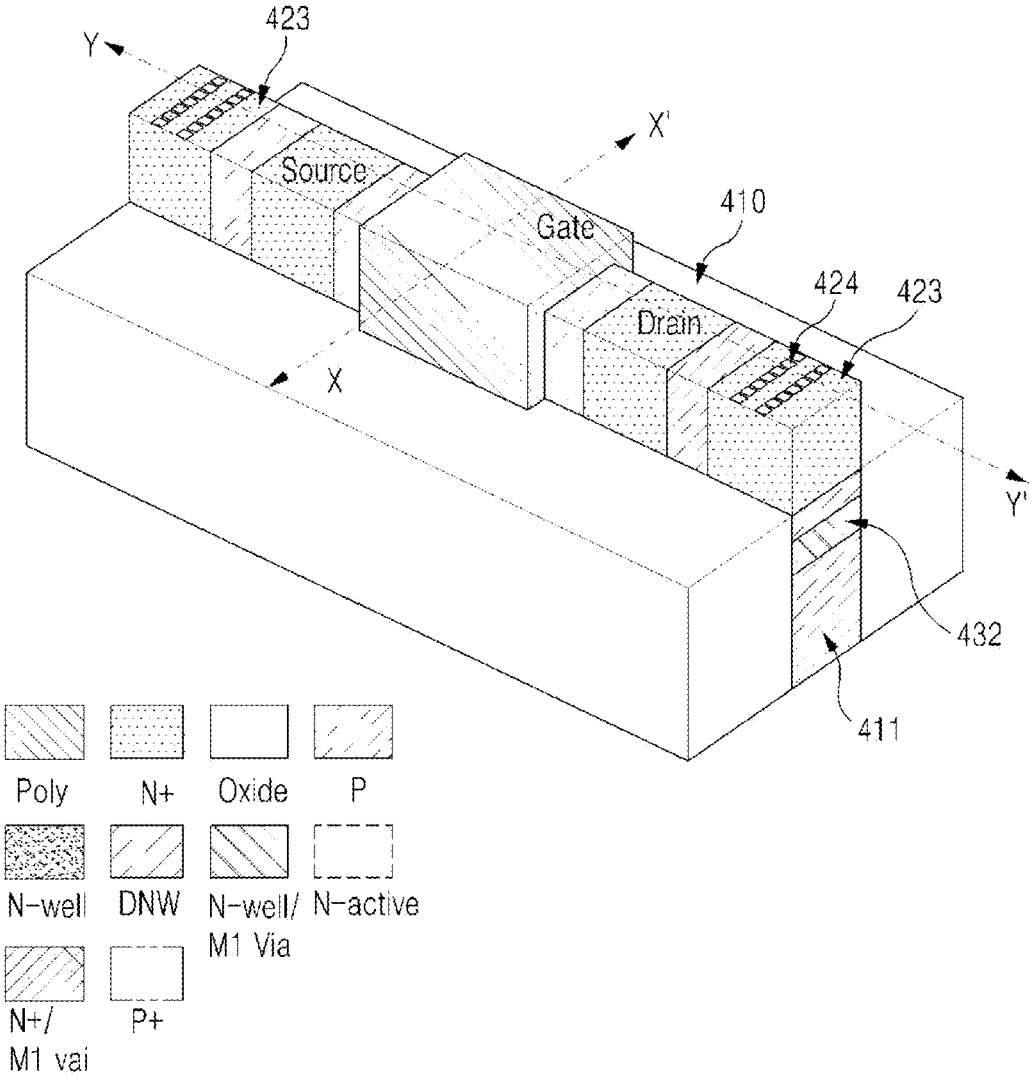
FIGS. 7A to 7C illustrate the radiation-tolerant 3D unit MOSFET, according to Embodiment 3 of the inventive concept.
Figure 7B:
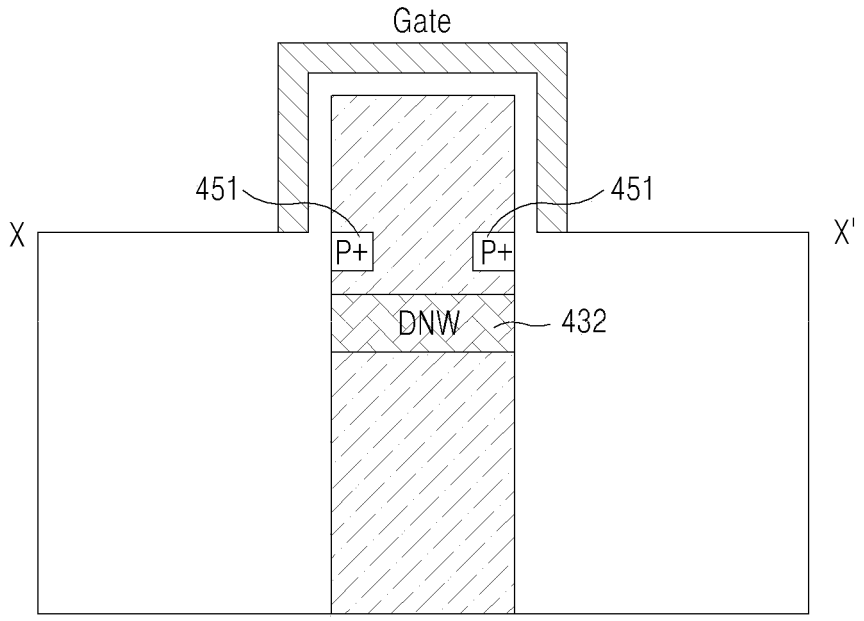
Figure 7C:
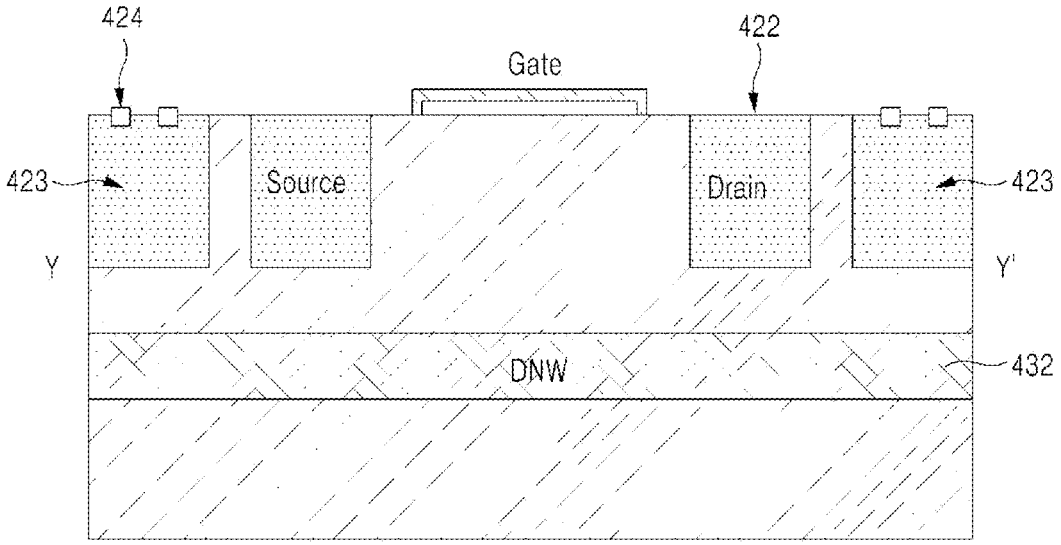

FIGS. 7A to 7C illustrate the radiation-tolerant 3D unit MOSFET according to Embodiment 3 of the inventive concept.

In more detail, FIG. 7A illustrates a schematic view of the radiation-tolerant 3D unit MOSFET according to Embodiment 3 of the inventive concept, FIG. 7B illustrates a sectional view taken along line X-X' of FIG. 7A, and FIG. 7C illustrates a sectional view taken along line Y-Y' of FIG. 7A.

Referring to FIGS. 7A to 7C, the radiation-tolerant 3D unit MOSFET 400 may include only the P+ layer 451, the DD 423, and the deep N-well layer (DNW) 432 on the bottom surface thereof. This structure does not have the shape of surrounding the radiation-tolerant 3D unit MOSFET 400 using the N-well layer 431, but the shape that the deep N-well layer (DNW) 432 is disposed on the bottom surface thereof.

Since the radiation-tolerant 3D unit MOSFET 400 may not apply an additional voltage to the bottom surface due to the PN junction formed between the [substrate 410] *body 411* and the deep N-well layer (DNW) 432, the current pulse generated due to the single event effect does not flow through the bottom surface. In addition, since electron hole pairs produced due to the single event effect are not collected at the lower end portion of the deep N-well layer (DNW) 432, the single event effect may be reduced.

The structure of the radiation-tolerant 3D unit MOSFET 400 illustrated in FIGS. 7A to 7C may be implemented with an area narrower than that of Embodiment 1, and may be easily used when the structure of Embodiment 1 violates a specific design rule in the commercial process or when the N-well layer 431 of surrounding the radiation-tolerant 3D unit MOSFET 400 may not be used.

Embodiment 4

Figure 8A:
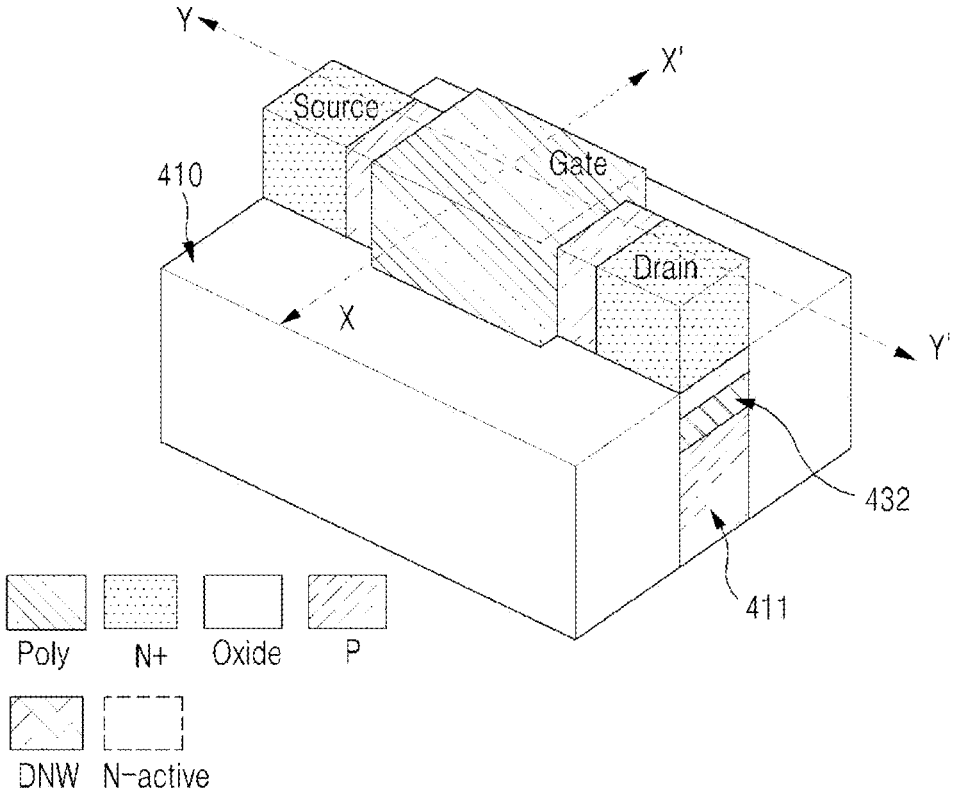
FIGS. 8A to 8C illustrate the radiation-tolerant 3D unit MOSFET, according to Embodiment 4 of the inventive concept.
Figure 8B:
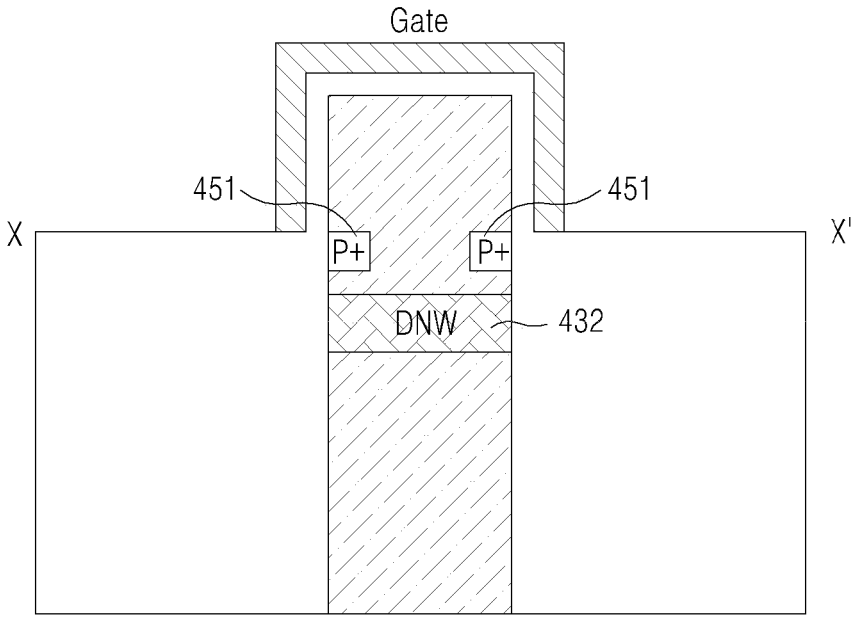
Figure 8C:
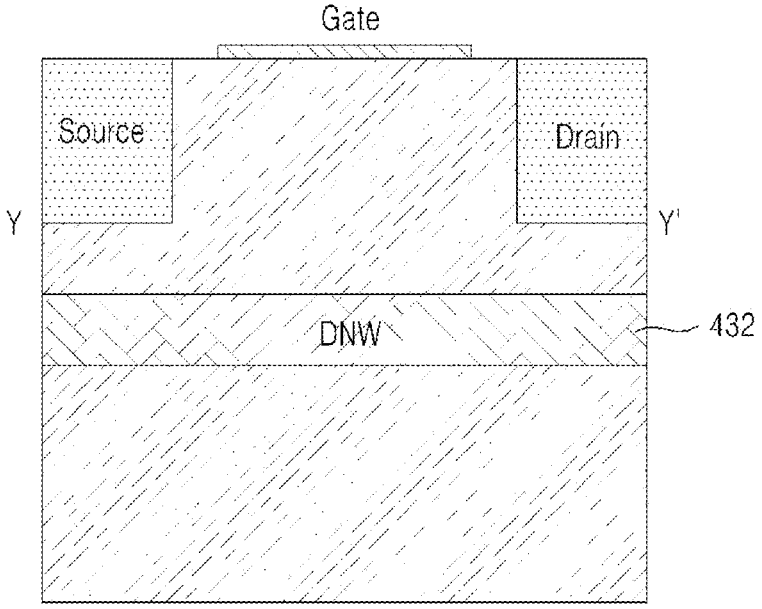

FIGS. 8A to 8C illustrate the radiation-tolerant 3D unit MOSFET according to Embodiment 4 of the inventive concept.

In more detail, FIG. 8A illustrates a schematic view of the radiation-tolerant 3D unit MOSFET according to Embodiment 4 of the inventive concept, FIG. 8B illustrates a sectional view taken along line X-X' of FIG. 8A, and FIG. 8C illustrates a sectional view taken along line Y-Y' of FIG. 8A.

Referring to FIGS. 8A to 8C, the radiation-tolerant 3D unit MOSFET 400 may include only the P+ layer 451, and the deep N-well layer (DNW) 432. In Embodiment 4, the radiation-tolerant 3D unit MOSFET 400 does not include the DD 423 and the N-well layer 431 surrounding the Fin structure.

Since the radiation-tolerant 3D unit MOSFET 400 may not apply an additional voltage to the bottom surface due to the PN junction formed between the [substrate 410] *body 411* and the deep N-well layer (DNW) 432, the current pulse generated due to the single event effect does not flow through the bottom surface. In addition, since electron hole pairs produced due to the single event effect are not collected at the lower end portion of the deep N-well layer (DNW) 432, the single event effect may be reduced.

The structure of the radiation-tolerant 3D unit MOSFET 400 illustrated in FIGS. 8A to 8C may be used under the condition that a unit device has to be designed with an area narrower than that of Embodiment 1, and may be easily used when the structure of Embodiment 1 violates a specific design rule in the commercial process or when the N-well layer 431 of surrounding the radiation-tolerant 3D unit MOSFET 400 may not be used.

Embodiment 5

Figure 9:
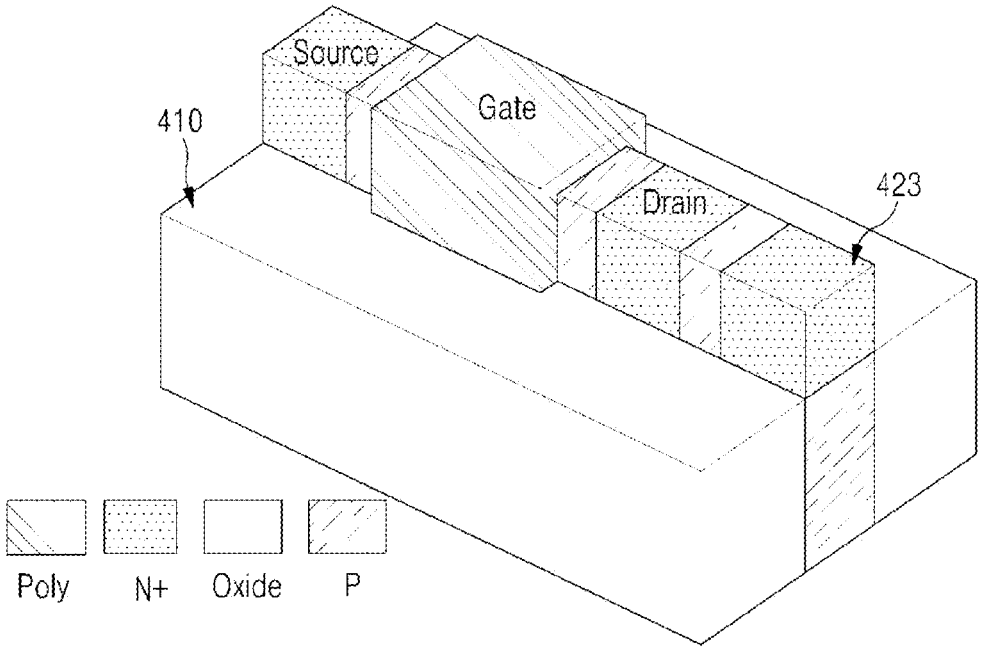
FIG. 9 illustrates the radiation-tolerant 3D unit MOSFET, according to Embodiment 5 of the inventive concept.

FIG. 9 illustrates the radiation-tolerant 3D unit MOSFET according to Embodiment 5 of the inventive concept.

Referring to FIG. 9, the radiation-tolerant 3D unit MOSFET 400 may include a DD 423 aligned in a row of the source 421—the gate 420,—the drain 422. In this case, a single DD 423 may be positioned on the lateral side surface of the source 421 or the drain 422.

The radiation-tolerant 3D unit MOSFET 400 illustrated in FIG. 9 may employ all the cases of applying all the DD 423, the N-well layer 431, and the deep N-well layer (DNW) 432 to the P+ layer 451, of applying only the DD 423 to the P+ layer 451, of applying the DD 423 and the deep N-well layer (DNW) 432 to the P+ layer 451, similarly to Embodiment 1, Embodiment 2, and Embodiment 3 described above.

Embodiment 6

Figure 10:
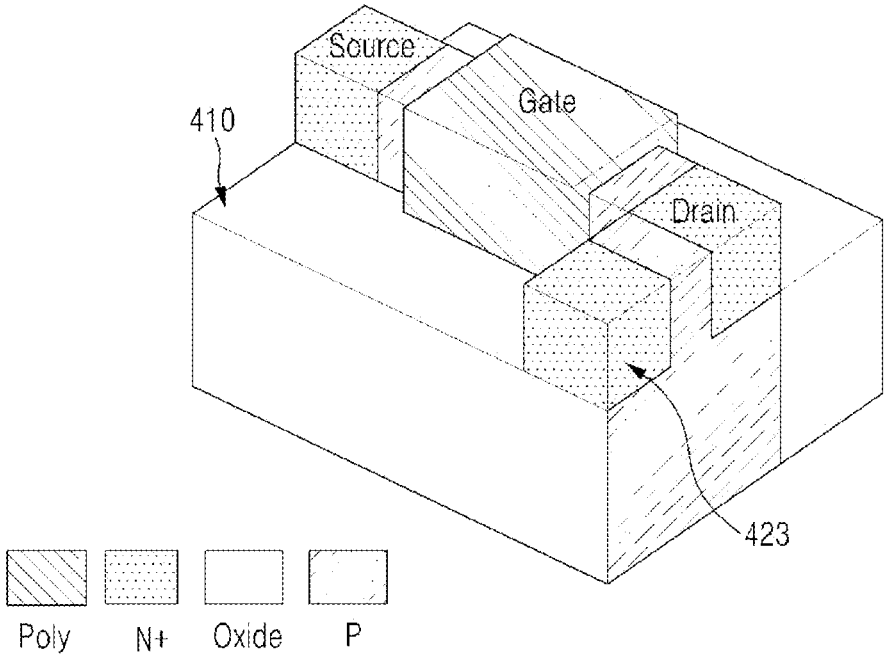
FIG. 10 illustrates the radiation-tolerant 3D unit MOSFET, according to Embodiment 6 of the inventive concept.

FIG. 10 illustrates the radiation-tolerant 3D unit MOSFET according to Embodiment 6 of the inventive concept.

Referring to FIG. 10, the radiation-tolerant 3D unit MOSFET 400 may include a single DD 423 disposed on the lateral side surface of the left side or the right side of the source 421 and the drain 422.

The radiation-tolerant 3D unit MOSFET 400 illustrated in FIG. 10 may employ all the cases of applying all the DD 423, the N-well layer 431, and the deep N-well layer (DNW) 432 to the P+ layer 451, of applying only the DD 423 to the P+ layer 451, of applying the DD 423 and the deep N-well layer (DNW) 432 to the P+ layer 451, similarly to Embodiment 1, Embodiment 2, and Embodiment 3 described above.

Embodiment 7

Figure 11:
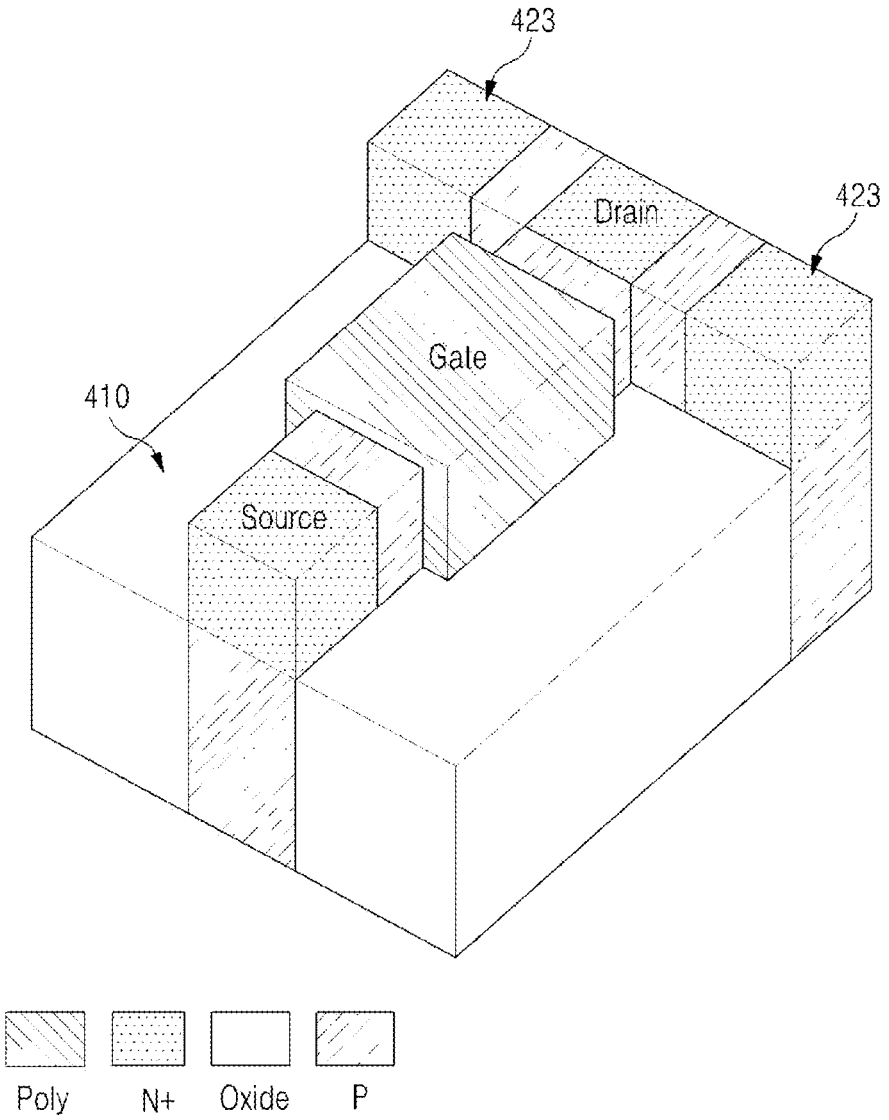
FIG. 11 illustrates the radiation-tolerant 3D unit MOSFET, according to Embodiment 7 of the inventive concept.

FIG. 11 illustrates the radiation-tolerant 3D unit MOSFET according to Embodiment 7 of the inventive concept.

Referring to FIG. 11, the radiation-tolerant 3D unit MOSFET 400 may include at least one DD 423 disposed on the lateral side surface of the left side or the right side of the source 421 and the drain 422. According to Embodiment 7, the at least one DD 423 is positioned on the lateral side surface of the source 421 and the drain 422 to represent the 'T' shape.

The radiation-tolerant 3D unit MOSFET 400 illustrated in FIG. 11 may employ all the cases of applying all the DD 423, the N-well layer 431, and the deep N-well layer (DNW) 432 to the P+ layer 451, of applying only the DD 423 to the P+ layer 451, and of applying the DD 423 and the deep N-well layer (DNW) 432 to the P+ layer 451, similarly to Embodiment 1, Embodiment 2, and Embodiment 3 described above.

Embodiment 8

Figure 12:
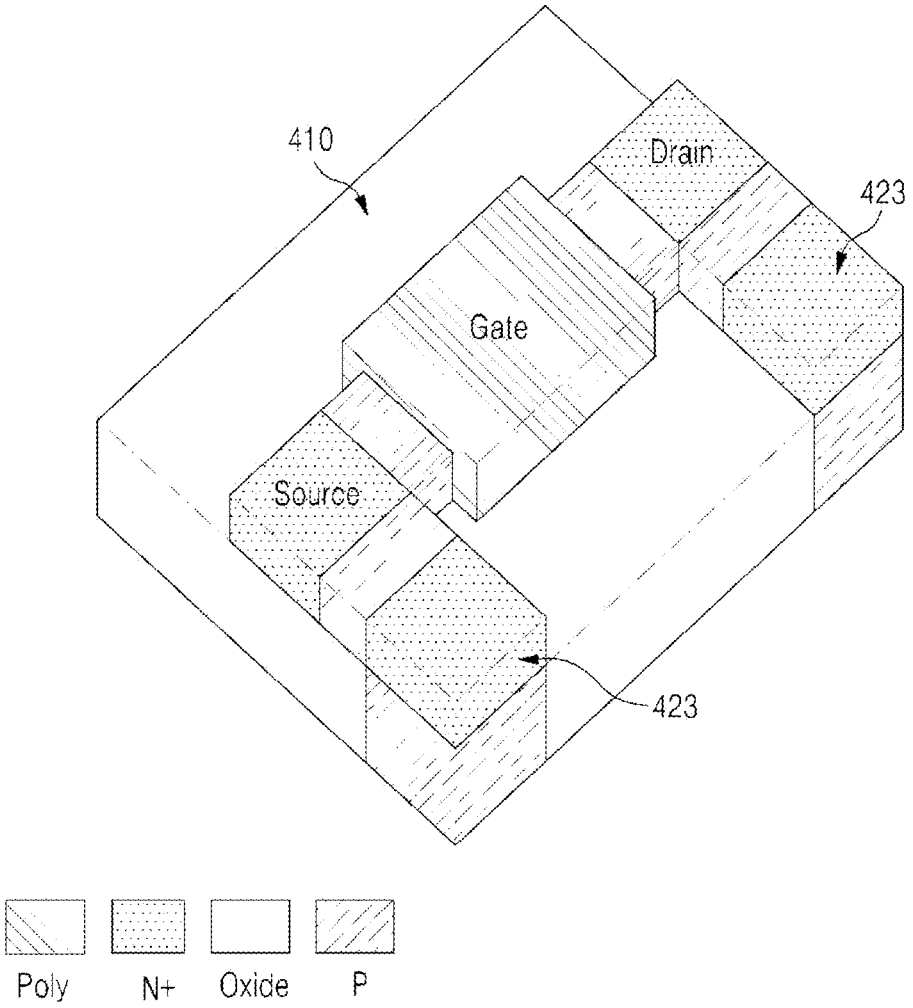
FIG. 12 illustrates the radiation-tolerant 3D unit MOSFET, according to Embodiment 8 of the inventive concept.

FIG. 12 illustrates the radiation-tolerant 3D unit MOSFET according to Embodiment 8 of the inventive concept.

Referring to FIG. 12, the radiation-tolerant 3D unit MOSFET 400 may include at least one DD 423 disposed on the lateral side surface of the left side or the right side of the source 421 and the drain 422. According to Embodiment 8, the at least one DD 423 is positioned on the lateral side surfaces of the source 421 and the drain 422 to represent the substantial 'C' shape.

The radiation-tolerant 3D unit MOSFET 400 illustrated in FIG. 12 may employ all the cases of applying all the DD 423, the N-well layer 431, and the deep N-well layer (DNW) 432 to the P+ layer 451, of applying only the DD 423 to the P+ layer 451, of applying the DD 423 and the deep N-well layer (DNW) 432 to the P+ layer 451, similarly to Embodiment 1, Embodiment 2, and Embodiment 3 described above.

Embodiment 9

Figure 13:
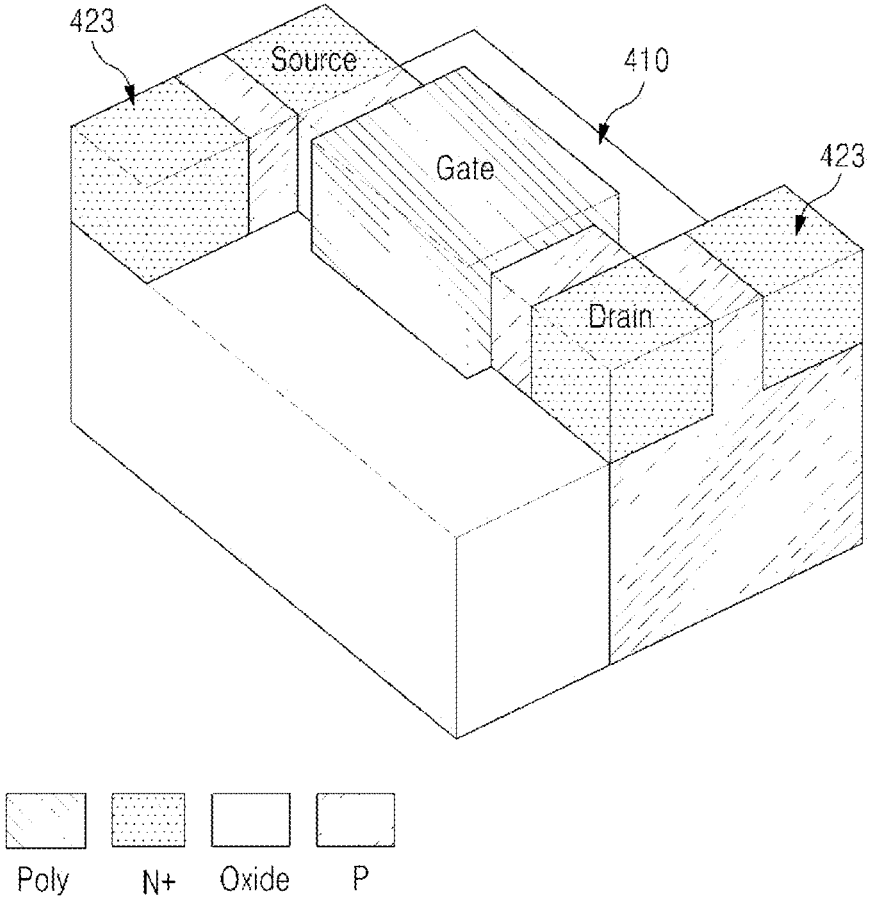
FIG. 13 illustrates the radiation-tolerant 3D unit MOSFET, according to Embodiment 9 of the inventive concept.

FIG. 13 illustrates the radiation-tolerant 3D unit MOSFET according to Embodiment 9 of the inventive concept.

Referring to FIG. 13, the radiation-tolerant 3D unit MOSFET 400 may include a single DD 423 disposed on each of lateral side surfaces of the left side and the right side of the source 421 and the drain 422. According to Embodiment 9, at least one DD 423 is positioned at the source 421 and the drain 422 one by one.

The radiation-tolerant 3D unit MOSFET 400 illustrated in FIG. 13 may employ all the case of applying all the DD 423, the N-well layer 431, and the deep N-well layer (DNW) 432 to the P+ layer 451, the case of applying only the DD 423 to the P+ layer 451, and the case of applying the DD 423 and the deep N-well layer (DNW) 432 to the P+ layer 451, similarly to Embodiment 1, Embodiment 2, and Embodiment 3 described above.

Embodiment 10

Figure 14:
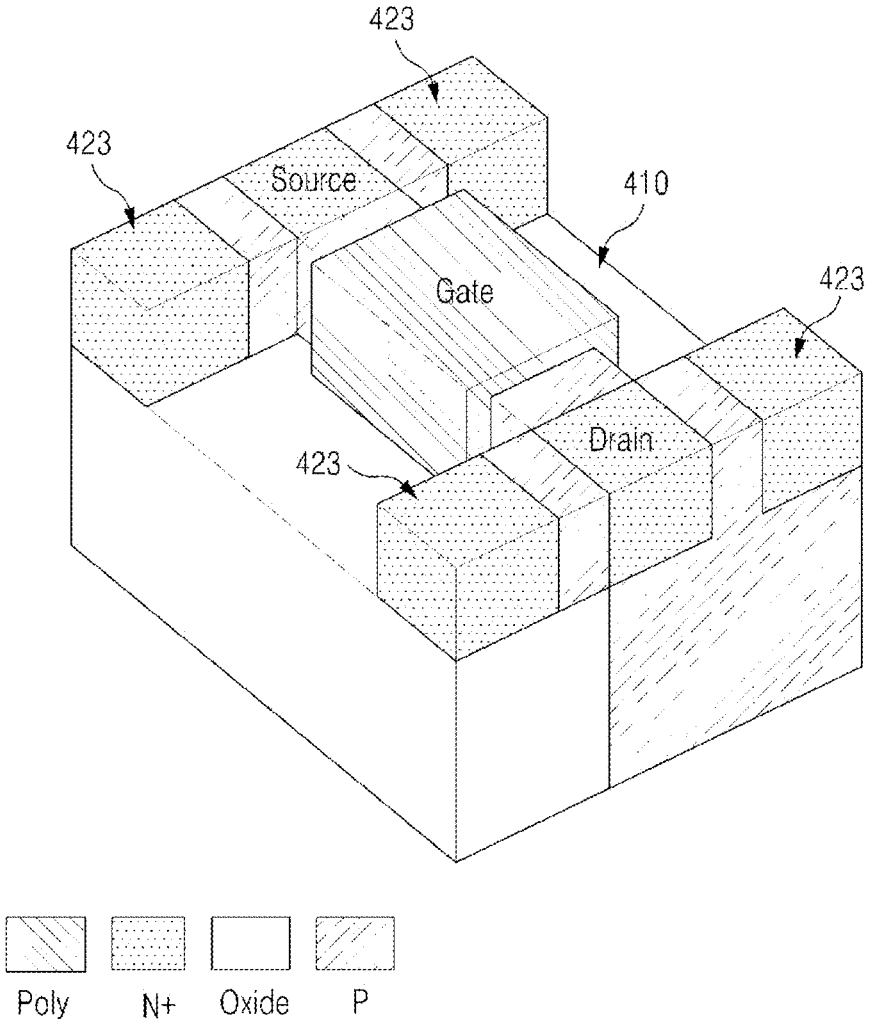
FIG. 14 illustrates the radiation-tolerant 3D unit MOSFET, according to Embodiment 10 of the inventive concept.

FIG. 14 illustrates the radiation-tolerant 3D unit MOSFET according to Embodiment 10 of the inventive concept.

Referring to FIG. 14, the radiation-tolerant 3D unit MOSFET 400 may include at least one DD 423 disposed on the lateral side surface of the left side and the right side of the source 421 and the drain 422. According to Embodiment 10, at least one DD 423 is positioned at both the left side and the right side of the source 421 and the drain 422 to represent the 'I' shape.

The radiation-tolerant 3D unit MOSFET 400 illustrated in FIG. 14 may employ all the cases of applying all the DD 423, the N-well layer 431, and the deep N-well layer (DNW) 432 to the P+ layer 451, of applying only the DD 423 to the P+ layer 451, of applying the DD 423 and the deep N-well layer (DNW) 432 to the P+ layer 451, similarly to Embodiment 1, Embodiment 2, and Embodiment 3 described above.

Figure 15:
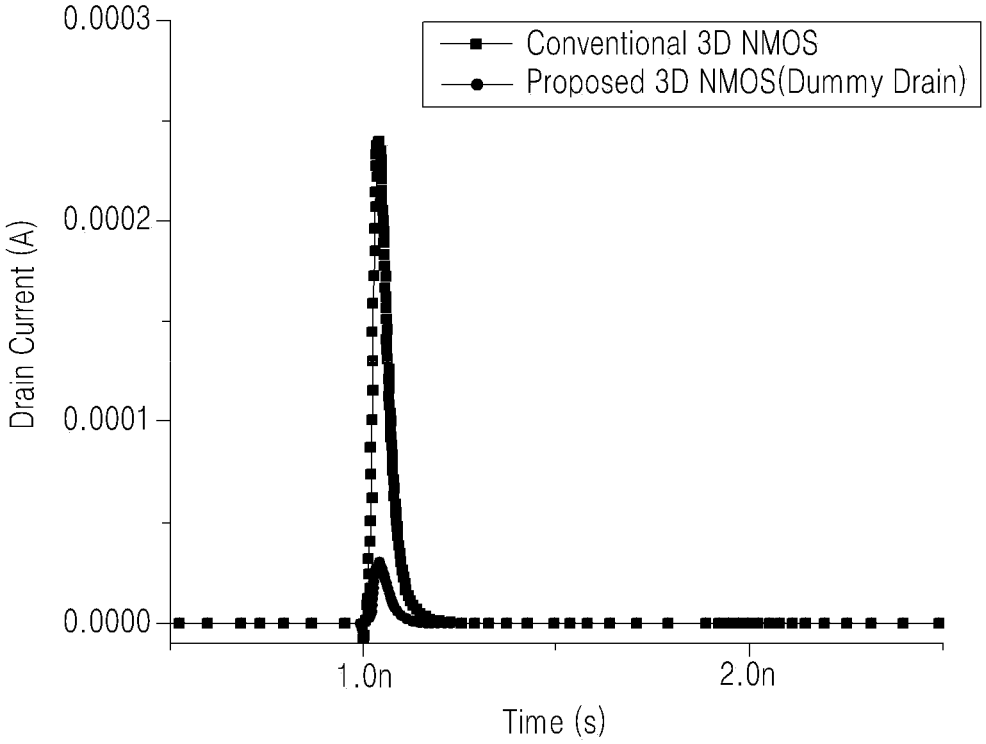
FIG. 15 is a graph illustrating the comparison in the waveform of a drain current between the conventional 3D unit MOSFET and the radiation-tolerant 3D unit MOSFET, according to an embodiment of the inventive concept.
Figure 16A:
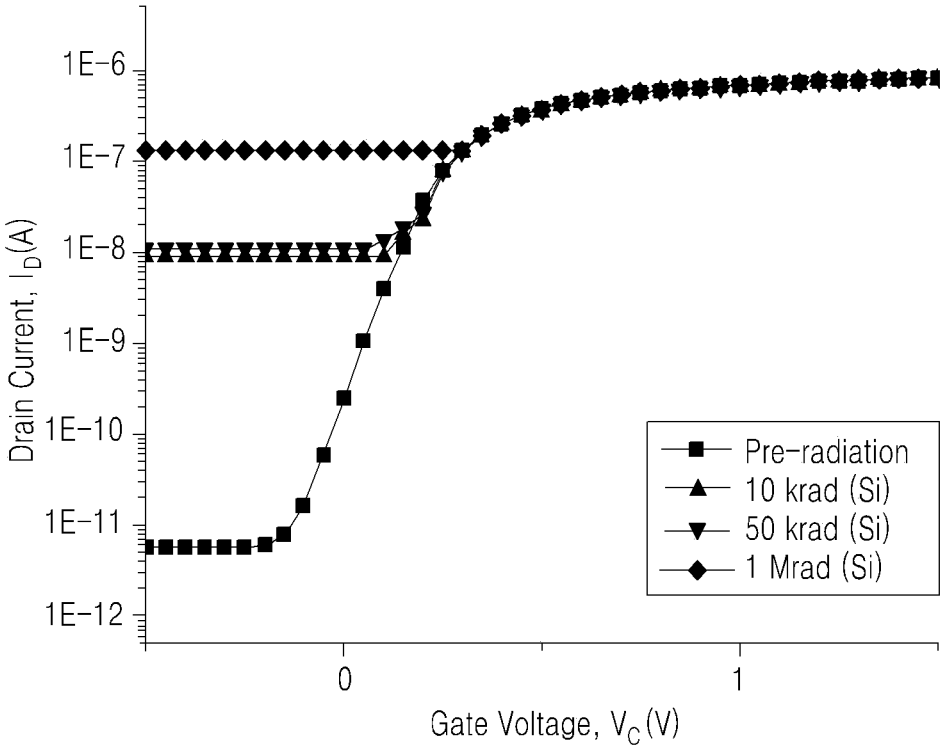
FIGS. 16A and 16B are graphs illustrating the comparison in a drain current as a function of a gate voltage between the conventional 3D unit MOSFET and the radiation-tolerant 3D unit MOSFET, according to an embodiment of the inventive concept.
Figure 16B:
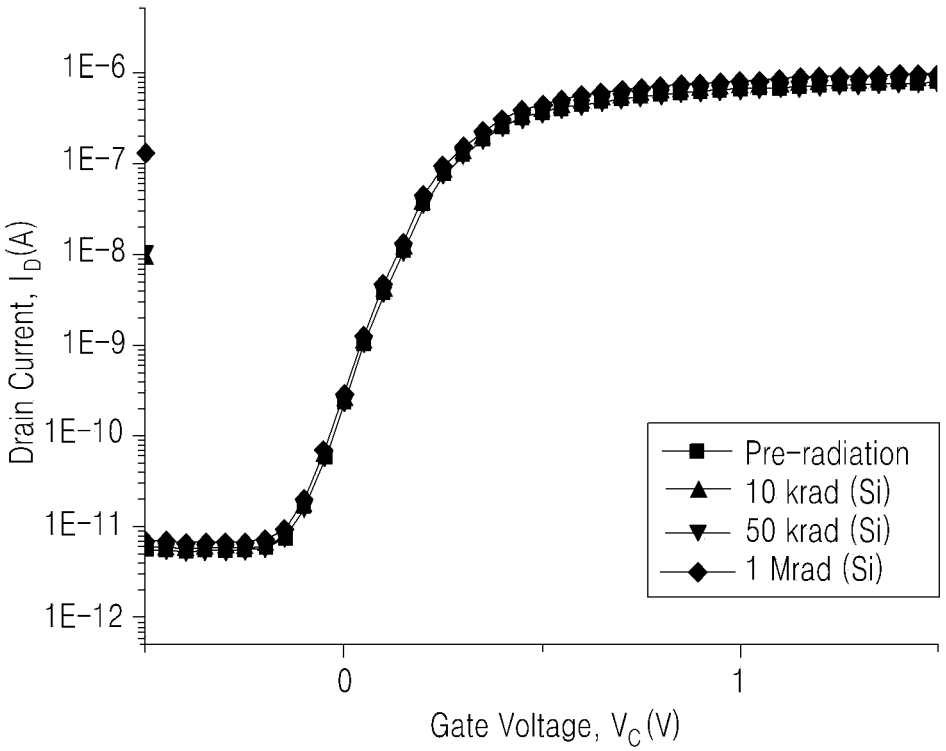
Figure 17A:
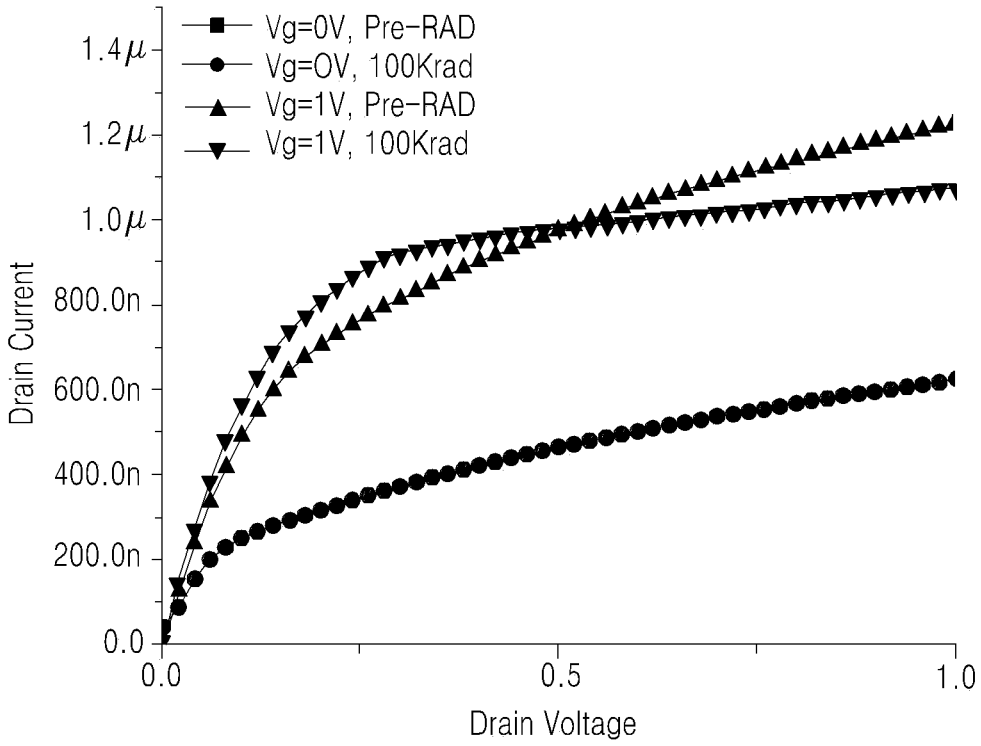
FIGS. 17A and 17B are graphs illustrating the comparison in a drain current as a function of a drain voltage between the conventional 3D unit MOSFET and the radiation-tolerant 3D unit MOSFET, according to an embodiment of the inventive concept.
Figure 17B:
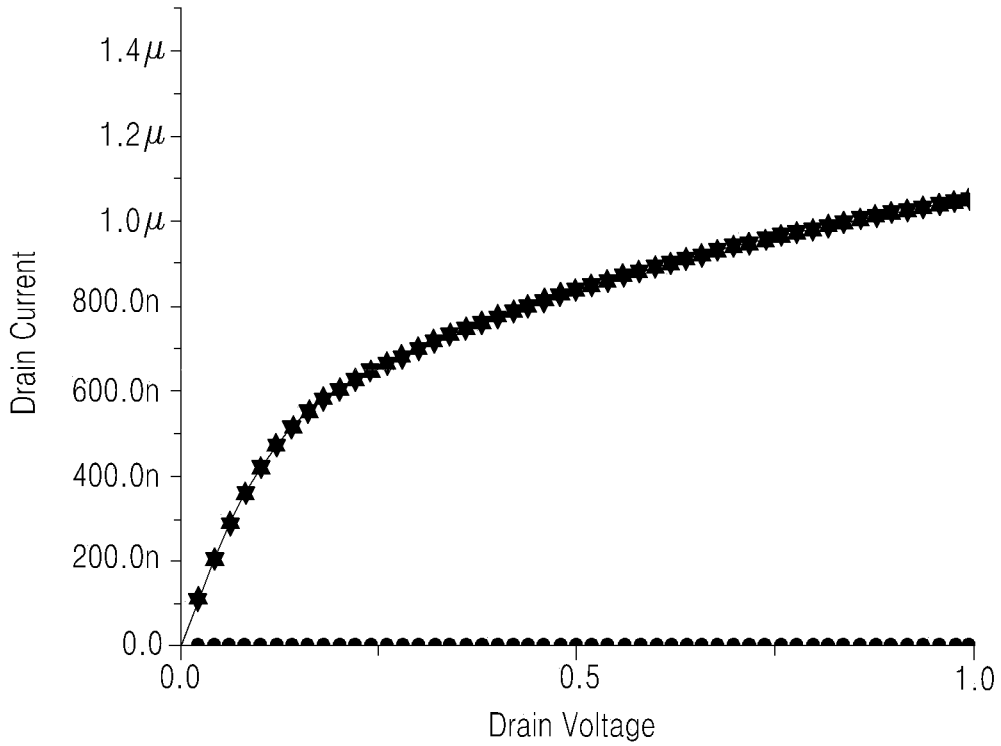

FIG. 15 is a graph illustrating the comparison in the waveform of a drain current between the conventional 3D unit MOSFET and the radiation-tolerant 3D unit MOSFET according to an embodiment of the inventive concept. FIGS. 16A and 16B are graphs illustrating the comparison in a drain current as a function of a gate voltage between the conventional 3D unit MOSFET and the radiation-tolerant 3D unit MOSFET according to an embodiment of the inventive concept. FIGS. 17A and 17B are graphs illustrating the comparison in a drain current as a function of a drain voltage between the conventional 3D unit MOSFET and the radiation-tolerant 3D unit MOSFET according to an embodiment of the inventive concept.

In more detail, FIG. 15 is a graph illustrating the comparison in the waveform of the drain current after the radiation is applied to the conventional NMOS (conventional 3D NMOS) and the proposed 3D NMOS (dummy drain) according to an embodiment of the inventive concept.

In addition, FIG. 16A is a graph illustrating the result of the drain current produced as the gate voltage is varied after the radiation is applied to the conventional 3D NMOS, and FIG. 16B is a graph illustrating the result of the drain current produced as the gate voltage is varied after the radiation is applied to the proposed 3D NMOS (dummy drain) according to an embodiment of the inventive concept.

In addition, FIG. 17A is a graph illustrating the result of the drain current produced as the drain voltage is varied after the radiation is applied to the conventional 3D NMOS, and FIG. 17B is a graph illustrating the result of the drain current produced as the drain voltage is varied after the radiation is applied to the proposed 3D NMOS (dummy drain) according to an embodiment of the inventive concept.

Referring to FIG. 15, it may be recognized from the experimental result that the proposed radiation-tolerant 3D unit MOSFET according to an embodiment of the inventive concept is more hardened against the single event effect than that of the conventional 3D NMOS since the radiation-tolerant 3D unit MOSFET according to an embodiment of the inventive concept represents more smooth waveform of the drain current (see a lower curve) than that of the conventional 3D NMOS. Referring to FIGS. 16 and 17, it may be recognized from the experimental result that the proposed radiation-tolerant 3D unit MOSFET according to an embodiment of the inventive concept is more hardened against the total ionization dose effect than that of the conventional 3D NMOS since the radiation-tolerant 3D unit MOSFET according to an embodiment of the inventive concept represents the inhibition of the variation in a current greater than that of the conventional 3D NMOS even if the total radiation is irradiated.

As described above, it may be recognized from FIGS. 15 to 17B that the proposed radiation-tolerant 3D unit MOSFET according to an embodiment of the inventive concept are more hardened against both the total ionization dose effect and the single event effect.

As described above, according to an embodiment of the inventive concept, there is provided the radiation-tolerant 3D unit MOSFET including at least a portion of the N-active layer, the N+ layer, the N-well layer, the deep N-well layer, the N+/Metal-1 via, the N-well/Metal-1 via, and the P+ layer. Accordingly, the current pulse generated from the single event effect may be reduced and the leakage current path may be prevented from being formed from the fixed charges generated at the field oxide film due to the total ionization dose effect. Therefore, the radiation-tolerant 3D unit MOSFET may be utilized in the space having the radiation environment having particle radiation and electromagnetic radiation, the exploration of another planet, and the design of electronic components which normally operate in a nuclear reactor of a nuclear power plant.

In addition, according to an embodiment of the inventive concept, the radiation-tolerant 3D unit MOSFET having the transistor layout, which is changed, may be applied to a bulk silicon substrate without an additional substrate such as a silicon on insulator (SOI) and a silicon on sapphire (SOS).

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The embodiments of the invention in which an exclusive property or privilege is claimed are defined as follows:

1. A radiation-tolerant 3-dimensional unit metal-oxide field-effect transistor (3D unit MOSFET) to reduce an influence by a current pulse generated due to a single event effect and an influence by a total ionization dose effect, the radiation-tolerant 3D unit MOSFET comprising:

a gate;

a source and a drain;

a dummy drain (DD) connected with the source and the drain to be positioned on a Fin structure of the radiation-tolerant 3D unit MOSFET and being able to apply a voltage to disperse the current pulse generated due to the influence by the single event effect; and an N-well layer formed while being spaced apart from the source and the drain, the gate, and the DD by a specific distance, wherein the N-well layer is formed on a surface of a substrate to surround the Fin structure of the radiation-tolerant 3D unit MOSFET, wherein at least one plane, lateral to the Fin structure, included in the gate has the shape of the surrounding plane according to the Fin structure of the radiation-tolerant 3D unit MOSFET.

2. The radiation-tolerant 3D unit MOSFET of claim 1, wherein the DD is positioned to be connected with a neutral region connected with at least one of the source and the drain.

3. The radiation-tolerant 3D unit MOSFET of claim 2, wherein the DD is connected with at least one lateral side surface of a left side and a right side of the source and the drain, and formed in a 'T' shape, a substantial 'C' shape, or the 'I' shape.

4. The radiation-tolerant 3D unit MOSFET of claim 1, wherein the DD applies a voltage to the source and the drain, disperses a current flowing through the source and the drain due to the single event effect, and reduces the influence exerted on a circuit region or a system connected with a MOSFET.

5. The radiation-tolerant 3D unit MOSFET of claim 1, further comprising:

an N-well/metal-1 via to additionally apply a voltage to the N-well layer, wherein the N-well/metal-1 via is formed in the surface of the substrate to overlap with the N-well layer.

6. The radiation-tolerant 3D unit MOSFET of claim 1, further comprising:

a deep N-well layer formed at a lower portion of the Fin structure of the radiation-tolerant 3D unit MOSFET.

7. The radiation-tolerant 3D unit MOSFET of claim 6, wherein the deep N-well layer is formed under the gate, the source, the drain, the DD, and the N-well layer positioned in the Fin structure of the radiation-tolerant 3D unit MOSFET and formed with a length to cover a horizontal length the N-well layer.

8. A radiation-tolerant 3-dimensional unit metal-oxide field-effect transistor (3D unit MOSFET) to reduce an influence by a current pulse generated due to a single event effect and an influence by a total ionization dose effect, the radiation-tolerant 3D unit MOSFET comprising:

a gate;

a source and a drain; and a P+ layer positioned on a lateral side surface of a field oxide film positioned at a contact point between the gate and a substrate to prevent a leakage current path from being formed due to the influence by the total ionization dose effect, wherein the P+ layer is subsequently formed using a P-type doping on the lateral side surface of the field oxide film.

9. The radiation-tolerant 3D unit MOSFET of claim 8, wherein the P+ layer prevents the leakage current path from being formed from a fixed charge produced at a surface of the field oxide film due to the influence by the total ionization dose effect.

10. The radiation-tolerant 3D unit MOSFET of claim 8, further comprising:

a DD (dummy drain) connected with the source and the drain to be positioned on a Fin structure of the radiation-tolerant 3-D unit MOSFET and being able to apply a voltage, wherein at least one plane, lateral to the Fin structure, included in the gate has the shape of the surrounding plane according to the Fin structure of the radiation-tolerant 3D unit MOSFET.

11. The radiation-tolerant 3D unit MOSFET of claim 10, further comprising:

an N-well layer formed while being spaced apart from the gate, the source and the drain, and the DD (dummy drain) by a specific distance; and a deep N-well layer formed at a lower portion of the Fin structure of the radiation-tolerant 3D unit MOSFET, such that the current pulse generated due to the single event effect to flow to the source and the drain is dispersed or blocked, wherein the N-well layer is formed on a surface of the substrate to surround the Fin structure of the radiation-tolerant 3D unit MOSFET.

12. A radiation-tolerant 3-dimensional unit metal-oxide field-effect transistor (3D unit MOSFET) to reduce an influence by a current pulse generated due to a single event effect and an influence by a total ionization dose effect, the radiation-tolerant 3D unit MOSFET comprising:

a gate;

a source and a drain;

a P+ layer positioned on a lateral side surface of a field oxide film positioned at a contact point between the gate and a substrate to prevent a leakage current path from being formed due to the influence by the total ionization dose effect, wherein the P+ layer is subsequently formed using a P-type doping on the lateral side surface of the field oxide film; and a deep N-well layer formed at a lower portion of the Fin structure of the radiation-tolerant 3D unit MOSFET.

13. The radiation-tolerant 3D unit MOSFET of claim 12, wherein the deep N-well layer blocks electron hole pairs, which are generated by the influence of the single event effect, from being collected.

*14. A radiation-tolerant integrated circuit comprising a plurality of 3-dimensional unit metal oxide silicon field effect transistors (3D unit MOSFETs), the plurality of 3D unit MOSFETs comprising:*

*a first 3D unit MOSFET comprising:*

*a first fin structure comprising a first source and a first drain;*

*a first gate positioned between the first source and the first drain so that the first source, the first gate and the first drain are aligned in a row; and*

*a P+ layer positioned internally in the first fin structure under the first gate and on a lateral side surface of the first fin structure; and*

*a second 3D unit MOSFET comprising:*

*a second fin structure comprising a second source and a second drain; and*

*a second gate positioned between the second source and the second drain so that the second source, the second gate and the second drain are aligned in a row; and*

*a dummy drain positioned at a side of the second drain that is not facing the second gate or at a side of the second source that is not facing the second gate.*

*15. The radiation-tolerant integrated circuit of claim 14, wherein the P+ layer reduces a leakage current path generated due to radiation, and wherein the dummy drain reduces an influence of a current pulse generated due to radiation.*

*16. The radiation-tolerant integrated circuit of claim 14, wherein the P+ layer comprises a plurality of separate P+ layers.*

*17. The radiation-tolerant integrated circuit of claim 14, wherein the P+ layer's position along the first fin structure's height corresponds to a lower end of the first gate along the first gate's height.*

*18. The radiation-tolerant integrated circuit of claim 14, further comprising a silicon neutral region positioned between the dummy drain and the second drain or between the dummy drain and the second source.*

*19. The radiation-tolerant integrated circuit of claim 18, wherein the second gate, the second source, the second drain and the dummy drain are aligned in a row.*

*20. The radiation-tolerant integrated circuit of claim 14, wherein the first 3D unit MOSFET further comprises an N-type dummy drain positioned at a side of the first drain that is not facing the first gate or at a side of the first source that is not facing the first gate, wherein the N-type dummy drain reduces an influence of a current pulse generated due to radiation.*

*21. The radiation-tolerant integrated circuit of claim 20, further comprising a silicon neutral region positioned between the N-type dummy drain and the first drain or between the N-type dummy drain and the first source.*

*22. The radiation-tolerant integrated circuit of claim 21, wherein the first gate, the first source, the first drain and the N-type dummy drain are aligned in a row.*

*23. The radiation-tolerant integrated circuit of claim 22, further comprising an N+/metal-1 via positioned on a surface of the N-type dummy drain.*

*24. The radiation-tolerant integrated circuit of claim 14, wherein the second 3D unit MOSFET is a P-channel MOSFET (PMOS), and wherein the dummy drain is doped to be P-type.*

*25. The radiation-tolerant integrated circuit of claim 24, wherein the first 3D unit MOSFET further comprises a deep N-well layer positioned under the first source, the first gate, the first drain, and the P+ layer, or wherein the second 3D unit MOSFET further comprises a deep P-well layer positioned under the second source, the second gate, the second drain, and the dummy drain.*

*26. The radiation-tolerant integrated circuit of claim 24, wherein the first 3D unit MOSFET further comprises an N-well layer positioned in a row with the first source, the first gate and the first drain, or wherein the second 3D unit MOSFET further comprises a P-well layer that is positioned in a row with the second source, the second gate, the second drain and the dummy drain.*

*27. The radiation-tolerant integrated circuit of claim 24, wherein the second 3D unit MOSFET further comprises a P+/metal-1 via positioned on a surface of the dummy drain.*

*28. A radiation-tolerant integrated circuit comprising a plurality of 3-dimensional unit metal oxide silicon field effect transistors (3D unit MOSFETs), the plurality of 3D unit MOSFETs comprising:*

*a first 3D unit MOSFET comprising:*

*a first source;*

*a first gate;*

*a first drain, wherein the first gate is positioned between the first source and the first drain so that the first source, the first gate and the first drain are aligned in a row;*

*a first body (330, 411), wherein the first body is under the first source, the first gate and the first drain; and*

*a P+ layer positioned internally in the first body under the first gate and on a lateral side surface of the first body.*

*29. The radiation-tolerant integrated circuit of claim 28, wherein the plurality of 3D unit MOSFETs further comprising:*

*a second 3D unit MOSFET comprising:*

*a second source;*

*a second gate:*

*a second drain, wherein the second gate is positioned between the second source and the drain so that the second source, the second gate and the second drain are aligned in a row;*

*a dummy drain positioned at a side of the second drain that is not facing the second gate or at a side of the second source that is not facing the second gate; and*

*a silicon neutral layer positioned between the dummy drain and the second drain or between the dummy drain and the second source.*

*30. The radiation-tolerant integrated circuit of claim 29, wherein the first 3D unit MOSFET and the second 3D unit MOSFET are each a gate-all-around (GAA) MOSFET.*

*31. The radiation-tolerant integrated circuit of claim 29, wherein the P+ layer reduces a leakage current path generated due to radiation, and wherein the dummy drain reduces an influence of a current pulse generated due to radiation.*

* * * * *